United States Patent
Maekawa et al.

(10) Patent No.: US 10,744,569 B2
(45) Date of Patent: Aug. 18, 2020

(54) SURFACE-COATED CUBIC BORON NITRIDE SINTERED MATERIAL TOOL

(71) Applicant: MITSUBISHI MATERIALS CORPORATION, Tokyo (JP)

(72) Inventors: Takuya Maekawa, Joso (JP); Masakuni Takahashi, Anpachi-gun (JP); Shun Sato, Anpachi-gun (JP); Kenji Yumoto, Anpachi-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/082,490

(22) PCT Filed: Mar. 2, 2017

(86) PCT No.: PCT/JP2017/008304
§ 371 (c)(1),
(2) Date: Sep. 5, 2018

(87) PCT Pub. No.: WO2017/154730
PCT Pub. Date: Sep. 14, 2017

(65) Prior Publication Data
US 2019/0111495 A1    Apr. 18, 2019

(30) Foreign Application Priority Data

Mar. 7, 2016  (JP) ................... 2016-043712
Feb. 27, 2017  (JP) ................... 2017-035010

(51) Int. Cl.
*B23B 27/14*  (2006.01)
*C04B 35/5831*  (2006.01)
(Continued)

(52) U.S. Cl.
CPC ............ *B23B 27/148* (2013.01); *B32B 18/00* (2013.01); *C04B 35/5831* (2013.01);
(Continued)

(58) Field of Classification Search
CPC . C23C 14/0617; C23C 14/0641; C23C 28/42; C23C 28/044
See application file for complete search history.

(56) References Cited

U.S. PATENT DOCUMENTS

2007/0269610 A1    11/2007  Fukui et al.
2016/0136735 A1*   5/2016   Matsuda ............... B23B 27/148
                                                              407/119

FOREIGN PATENT DOCUMENTS

JP    H-0782031 A  *  3/1995
JP    08-119774 A     5/1996
(Continued)

OTHER PUBLICATIONS

International Search Report dated May 23, 2017 for the corresponding PCT International Application No. PCT/JP2017/008304.

*Primary Examiner* — Laura A Auer
(74) *Attorney, Agent, or Firm* — Leason Ellis LLP

(57) ABSTRACT

The present invention is directed to a surface-coated cubic boron nitride sintered material tool including a cBN substrate and a hard coating layer formed on a surface of the cBN substrate and having an alternate laminated structure of A layer and B layer. A peak of the grain size distribution of cBN grains in the cBN sintered material is present within a range of a grain size from 0.50 to 1.00 μm. The A layer has a composition of $(Ti_{1-x}Al_x)N$ (0.4≤x≤0.7 in an atomic ratio). The B layer has a composition of $(Cr_{1-y-z}Al_yM_z)N$ (0.03≤y≤0.6 and 0≤z≤0.05 in an atomic ratio). An X-ray diffraction peak of a (200) plane is present at a position of a diffraction angle of 43.6 plus or minus 0.1 degrees, and a plastic deformation work ratio of the B layer is 0.35 to 0.50.

4 Claims, 4 Drawing Sheets

(51) Int. Cl.
*C04B 41/87* (2006.01)
*C04B 41/89* (2006.01)
*B32B 18/00* (2006.01)
*C04B 35/645* (2006.01)
*C04B 41/52* (2006.01)
*C04B 41/00* (2006.01)
*C23C 14/32* (2006.01)
*C23C 14/06* (2006.01)
*C23C 14/50* (2006.01)

(52) U.S. Cl.
CPC .......... *C04B 35/645* (2013.01); *C04B 41/009* (2013.01); *C04B 41/52* (2013.01); *C04B 41/87* (2013.01); *C04B 41/89* (2013.01); *C23C 14/0641* (2013.01); *C23C 14/325* (2013.01); *C23C 14/505* (2013.01); *B23B 2224/04* (2013.01); *B23B 2224/08* (2013.01); *B23B 2224/24* (2013.01); *B23B 2224/28* (2013.01); *B23B 2224/32* (2013.01); *B23B 2224/36* (2013.01); *B23B 2226/125* (2013.01); *B23B 2228/10* (2013.01); *B23B 2228/24* (2013.01); *B23B 2228/36* (2013.01); *B23B 2228/44* (2013.01); *C04B 2235/3217* (2013.01); *C04B 2235/386* (2013.01); *C04B 2235/3813* (2013.01); *C04B 2235/3843* (2013.01); *C04B 2235/3847* (2013.01); *C04B 2235/3856* (2013.01); *C04B 2235/3865* (2013.01); *C04B 2235/3886* (2013.01); *C04B 2235/5436* (2013.01); *C04B 2235/5445* (2013.01); *C04B 2235/6581* (2013.01); *C04B 2235/661* (2013.01); *C04B 2235/785* (2013.01); *C04B 2237/36* (2013.01); *C04B 2237/361* (2013.01); *C04B 2237/366* (2013.01); *C04B 2237/704* (2013.01)

(56) References Cited

FOREIGN PATENT DOCUMENTS

| JP | 2008-188734 | A |   | 8/2008 |   |
|----|---|---|---|---|---|
| JP | 4191663 | B |   | 12/2008 |   |
| JP | 2009-101491 | A |   | 5/2009 |   |
| JP | 2010-012564 | A |   | 1/2010 |   |
| JP | 2011-506115 | A |   | 3/2011 |   |
| JP | 2014-083664 | A |   | 5/2014 |   |
| JP | 2014091169 | A | * | 5/2014 |   |
| JP | 2016-026893 | A |   | 2/2016 |   |
| JP | 2017-042906 | A |   | 3/2017 |   |
| WO | WO-2006/070730 | A |   | 7/2006 |   |
| WO | WO-2009/079184 | A |   | 6/2009 |   |
| WO | WO-2015163059 | A1 | * | 10/2015 | ........... B23B 27/148 |

* cited by examiner (a)

(b)

10,744,569 B2

SURFACE-COATED CUBIC BORON NITRIDE SINTERED MATERIAL TOOL

CROSS-REFERENCE TO RELATED PATENT APPLICATIONS

This application is a U.S. National Phase Application under 35 U.S.C. § 371 of International Patent Application No. PCT/JP2017/008304, filed Mar. 2, 2017, and claims the benefit of Japanese Patent Application No. 2016-043712, filed on Mar. 7, 2016, and Japanese Patent Application No. 2017-035010, filed on Feb. 27, 2017, all of which are incorporated herein by reference in their entirety. The International Application was published in Japanese on Sep. 14, 2017 as International Publication No. WO/2017/154730 under PCT Article 21(2).

FIELD OF THE INVENTION

The present invention relates to a surface-coated cubic boron nitride sintered material tool having both wear resistance and fracture resistance. Specifically, the invention relates to a surface-coated tool having, as a tool body, a cubic boron nitride (hereinafter, also referred to as "cBN") sintered material having excellent wear resistance and fracture resistance in strong intermittent cutting of alloy steel or the like and exhibiting excellent cutting performance for long-term use (hereinafter, also referred to as "coated cBN tool").

BACKGROUND OF THE INVENTION

In general, surface-coated cutting tools include indexable inserts which are detachably attached to a tip portion of an insert holder in turning or planning of work materials such as various kinds of steel or cast iron, drills or miniature drills which are used in drilling or the like of the work materials, and solid end mills which are used in face milling, grooving, shoulder milling, or the like of the work materials. In addition, throw away end mill tools or the like have been known which include the indexable insert detachably attached thereto and perform cutting in the same manner as the solid end mills.

In addition, as a coated tool, coated tools in which the surface of a body made of tungsten carbide (hereinafter, represented by WC)-based cemented carbide, titanium carbonitride (hereinafter, represented by TiCN)-based cermet, or a cubic boron nitride sintered material (hereinafter, represented by cBN) (hereinafter, collectively referred to as a tool body) is coated with a complex nitride layer of Cr and Al ((Cr, Al)N) or a complex nitride layer of Ti and Al ((Ti, Al)N) as a hard coating layer through an arc ion plating method have been known.

In addition, many proposals have been made in order to improve the cutting performance of the coated tool.

For example, in Japanese Unexamined Publication No. 2008-188734, it is proposed that a hard coating layer formed of a (Cr, Al)N layer, which has biaxial crystal orientation and is formed of a complex nitride layer of Cr and Al satisfying a composition formula $(Cr_{1-x}Al_x)N$ (x is 0.40 to 0.70 in terms of atomic ratio), and in which in a case where crystal orientation analysis by EBSD is carried out in regard to the complex nitride layer, an area ratio of crystal grains having crystal orientation <100> within a range of 0 to 15 degrees from a normal direction of a surface polishing face is 50% or more, and an area ratio of crystal grains having crystal orientation <100> within a range of 15 degrees around a maximum peak existing within a range of 0 to 54 degrees with respect to an optional direction orthogonal to a normal line of the surface polishing face is 50% or more, is formed on a surface of a tool body, and thus the fracture resistance of the hard coating layer in heavy cutting is improved.

In Japanese Unexamined Publication No. 2010-12564, it is proposed that a hard coating layer 1 is coated on the surface side, a hard coating layer 2 is coated on the tool body side, the hard coating layer 1 is $(Cr_{1-a}Al_a)N_x$, where $0.5 \le a \le 0.75$ and $0.9 \le x \le 1.1$, the hard coating layer 2 is $(Ti_bAl_{1-b})N_y$, where $0.4 \le b \le 0.6$ and $0.9 \le y \le 1.1$, in a case where the lattice constant of the (200) plane of the hard coating layer 1 by X-ray diffraction is $\alpha_1$ (nm), $0.411 \le \alpha_1 \le 0.415$, and in a case where the lattice constant of the (200) plane of the hard coating layer 2 is $\alpha_2$ (nm), $0.413 \le \alpha_2 \le 0.418$, so that high hardness is maintained and a reduction in the residual compression stress is achieved, and moreover, the adhesion strength between the hard coating layers 1 and 2 is increased to increase the service life of the tool of a coated tool.

In Japanese Unexamined Publication No. H8-119774 and Japanese Patent No. 4191663, it is proposed that on a body formed of a cBN sintered material containing 20 vol % or more of cubic boron nitride, a hard heat-resistant film having a composition represented by $(Ti_{1-x}Al_x)N$ (here, $0.3 \le x \le 0.7$) is provided at a place related to at least cutting to improve the strength and the wear resistance as a cutting tool.

In Japanese Unexamined Publication No. 2009-101491, it is proposed that in a case where a lower layer formed of a (Ti, Al)-based complex nitride or complex carbonitride layer and an upper layer formed of a (Cr, Al)-based complex nitride layer are coated on a surface of a tool body made of tungsten carbide-based cemented carbide or titanium carbonitride-based cermet, and the upper layer is configured to have an alternate laminated structure of a thin layer A having a cubic structure and a thin layer B in which a cubic structure and a hexagonal structure are mixed, the lubricity and the wear resistance in high-speed strong intermittent cutting are improved.

Japanese Unexamined Publication No. 2009-101491 describes that in a case where the lower layer is represented by a composition formula $(Ti_{1-Q-R}Al_QM_{1R})(C, N)$, the lower layer is a complex nitride or complex carbonitride layer of Ti, Al, and $M_1$ satisfying $0.4 \le Q \le 0.65$ and $0 \le R \le 0.1$ (Q represents a content ratio of Al in terms of atomic ratio, R represents a total content ratio of the component $M_1$ in terms of atomic ratio, and the component $M_1$ represents one or more elements selected from Si, B, Zr, Y, V, W, Nb, and Mo.), in a case where the thin layer A is represented by a composition formula $(Cr_{1-\alpha-\beta}Al_\alpha M_{2\beta})N$, the thin layer A is a complex nitride layer of Cr, Al, and $M_2$ having a cubic structure satisfying $0.25 \le \alpha \le 0.65$ and $0 < \beta \le 0.1$ ($\alpha$ represents a content ratio of Al in terms of atomic ratio, $\beta$ represents a total content ratio of the component $M_2$ in terms of atomic ratio, and the component $M_2$ represents one or more elements selected from Zr, Y, V, W, Nb, Mo, and Ti.), and in a case where the thin layer B is represented by a composition formula $(Cr_{1-\gamma-\delta}Al_\gamma M_{3\delta})N$, the thin layer B is a complex nitride layer of Cr, Al, and $M_3$ satisfying $0.75 \le \gamma \le 0.95$ and $0 < \delta \le 0.1$ ($\gamma$ represents a content ratio of Al in terms of atomic ratio, $\delta$ represents a total content ratio of the component $M_3$ in terms of atomic ratio, and the component $M_3$ represents one or more elements selected from Zr, Y, V, W, Nb, Mo, and Ti.).

Technical Problem

In recent years, performance of machine tools has been significantly improved, and there is a strong demand for power saving, energy saving, and cost reduction in cutting. In addition, there is a tendency that the efficiency of the cutting is enhanced.

The conventional coated tools proposed in Japanese Unexamined Publication No. 2008-188734, Japanese Unexamined Publication No. 2010-12564, Japanese Unexamined Publication No. H8-119774, Japanese Patent No. 4191663 and Japanese Unexamined Publication No. 2009-101491 have no particular problems when being used for cutting of steel or cast iron under normal conditions. However, particularly, in a case where the coated tools are used under strong intermittent cutting conditions in which an intermittent and impact high load acts on a cutting edge, fractures or the like are likely to occur, and satisfactory wear resistance may not be obtained. Accordingly, the end of the service life of the tool is reached in a relatively short period of time.

Solution to Problem

Accordingly, the inventors have conducted intensive studies from the above-described viewpoint to develop a coated tool in which a hard coating layer exhibits excellent fracture resistance and wear resistance in strong intermittent cutting, and as a result, obtained the following knowledge.

(a) First, from Japanese Unexamined Publication No. 2008-188734, Japanese Unexamined Publication No. 2010-12564 and Japanese Unexamined Publication No. 2009-101491, it has already been known that in conventional coated tools having a hard coating layer formed of a (Cr, Al)N layer or a (Cr, Al, M)N layer, Al as a constituent component of the hard coating layer improves high-temperature hardness and heat resistance, Cr improves a high-temperature strength, and acts to improve high-temperature oxidation resistance in a state in which Cr and Al are contained in a coexistent manner, characteristics of the hard coating layer are improved in accordance with the kind of the component M such that in a case where the additional component M is Zr, heat-resistant plastic deformability is improved, in a case where the additional component M is V, lubricity is improved, in a case where the additional component M is Nb, high-temperature wear resistance is improved, in a case where the additional component M is Mo, welding resistance is improved, in a case where the additional component M is W, heat radiation is improved, and in a case where the additional component M is Ti, high-temperature hardness is further improved, and the fracture resistance, the welding resistance, the oxidation resistance, and the wear resistance of the hard coating layer are improved in a case where the hard coating layer contains the components M.

(b) In addition, from Japanese Unexamined Publication No. 2010-12564, Japanese Unexamined Publication No. H8-119774, Japanese Patent No. 4191663 and Japanese Unexamined Publication No. 2009-101491, it has also been known that the (Ti, Al)N layer has an excellent high-temperature strength and has an excellent high-adhesion strength to the tool body and the (Cr, Al, M)N layer, and thus in a case where the hard coating layer is formed as a layer having a lamination structure of A layer and B layer in which the A layer is the (Ti, Al)N layer and the B layer is the (Cr, Al, M)N layer, the whole hard coating layer has an excellent high-temperature strength, and a coated tool having excellent fracture resistance is provided.

(c) However, the inventors have found that in a case where the hard coating layer has an alternate laminated structure in which at least one A layer and at least one B layer are alternately laminated, and composition ranges of the constituent components of the A layer and the B layer are appropriately selected, the hardness and the plastic deformability of the B layer can be balanced, and thus an intermittent and impact high load acting on a cutting edge in cutting can be relaxed, and the fracture resistance of the hard coating layer can be improved.

In addition, the inventors have performed a nano-indentation test on the B layer ((Cr, Al, M)N layer) according to the invention, and confirmed that the value of a plastic deformation work ratio $W_{plast}/(W_{plast}+W_{elast})$ is within a range of 0.35 to 0.50.

(d) Moreover, the inventor has found that adhesion strength between a hard coating layer constituted of an alternate laminated structure having the A layer and the B layer, and a cBN body can be improved by restricting the component composition of a tool body constituted of a cubic boron nitride sintered material (which will hereinafter be referred to as a "cBN body") to within a suitable range and adjusting a grain size distribution of cBN grains in the cBN sintered material. The inventor has also found that when an XRD measurement is performed for a hard coating layer in its entirety, in a case in which an X-ray diffraction peak position of a (200) plane and a full width at half maximum of diffraction strength at the peak position indicate particular values, fracture resistance of the hard coating layer is further improved, and more excellent fracture resistance and wear resistance are exhibited for a long-term usage.

SUMMARY OF THE INVENTION

The invention has been contrived based on the above-described study results, and has the following configuration.

"(1) A surface-coated cubic boron nitride sintered material tool including: a tool body which is made of a cubic boron nitride sintered material; and a hard coating layer formed on a surface of the tool body, the hard coating layer being made of an alternate laminated structure, in which at least one A layer and at least one B layer are alternately laminated, and having a total layer thickness of 0.5 to 4.0 μm, wherein (a) the cubic boron nitride sintered material has a composition including: 10 to 50 vol % of one or more of TiC, TiN, and TiCN; 0.1 to 2 vol % of WC; 0.3 to 5 vol % of AlN; 2 to 10 vol % of $TiB_2$; 1.5 to 10 vol % of $Al_2O_3$; and 30 to 80 vol % of cBN (cubic boron nitride), (b) when a grain size distribution of cBN grains in the cubic boron nitride sintered material is measured, a peak of the grain size distribution is present within a range of a grain size from 0.50 to 1.00 μm, and a value of a full width at half maximum of the peak satisfies a range from 0.33 to 0.73 μm, (c) the A layer is a Ti and Al complex nitride layer, which has an average single layer thickness of 0.1 to 3.0 μm and has an average composition satisfying $0.4 \leq c \leq 0.7$ (x represents a content ratio of Al in terms of atomic ratio) in a case where the A layer is represented by a composition formula $(Ti_{1-x}Al_x)N$, (d) the B layer is a Cr, Al and M complex nitride layer, which has an average single layer thickness of 0.1 to 3.0 μm and has an average composition satisfying $0.03 \leq y \leq 0.6$ and $0 \leq z \leq 0.05$ (y represents a content ratio of Al in terms of atomic ratio, z represents a total content ratio of the component M in terms of atomic ratio, and the component M represents one or more elements selected from group4a elements excluding Cr, group5a elements, group 6a elements, B and Si in the periodic table) in a case where the B layer is represented by a composition formula $(Cr_{1-y-z}Al_yM_z)N$, and (e) when an X-ray diffraction measurement is performed for the entirety of a hard coating layer constituted of the A layer and the B layer, an X-ray diffraction peak of a (200) plane is present at a position of a diffraction angle of 43.6 plus or minus 0.1 degrees, and a full width at half maximum of the diffraction peak satisfies 0.25 plus or minus 0.05 degrees.

(2) The surface-coated cubic boron nitride sintered material tool according to the above-described (1), wherein a value of a plastic deformation work ratio $W_{plast}/(W_{plast}+W_{elast})$ of the B layer, which is obtained by performing a nanoindentation test for the B layer with a load set to achieve an indentation depth of 1/10 times or smaller than a layer thickness, is within a range from 0.35 to 0.50."

Advantageous Effect of the Invention

A coated tool (surface-coated cubic boron nitride sintered material tool) according to the invention has a hard coating layer having an alternate laminated structure in which at least one A layer formed of $(Ti_{1-x}Al_x)N$ and at least one B layer formed of $(Cr_{1-y-z}Al_yM_z)N$ are alternately laminated. Accordingly, the whole hard coating layer has an excellent adhesion strength and excellent wear resistance, and also has an excellent adhesion strength to the cBN substrate. Moreover, according to a preferable aspect of the present invention, the B layer on the outermost surface of the hard coating layer has high hardness (28 to 42 GPa, in a nanoindentation test performed with a load set to have an indentation depth of 1/10 times or smaller than the layer thickness of the B layer), and a plastic deformation work ratio $W_{plast}/(W_{plast}+W_{elast})$ is within a range from 0.35 to 0.50. Furthermore, the cBN body itself has excellent wear resistance and fracture resistance. Therefore, since the hard coating layer has an effect of relaxing a shock, this coated tool exhibits excellent wear resistance for a long period of time without generating fractures or the like even in strong intermittent cutting work of alloy steel, in which intermittent and impacting heavy loads act on a cutting edge.

DETAILED DESCRIPTION OF THE INVENTION

Figure 2:
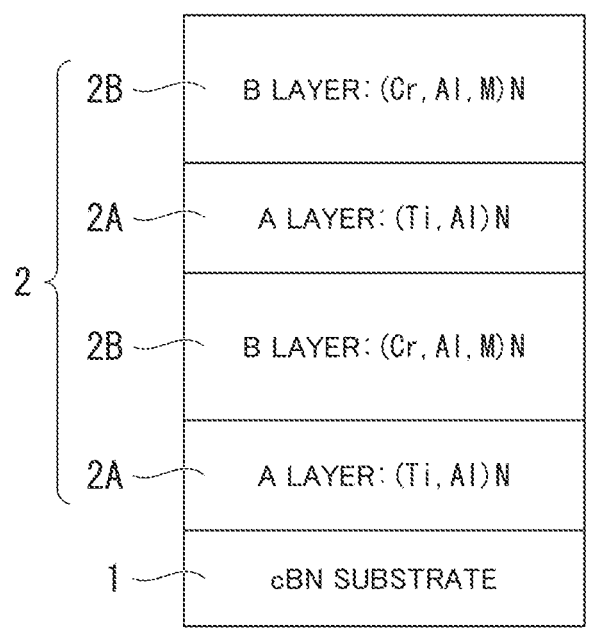
FIG. 2 illustrates an example of a schematic view of a vertical section of a hard coating layer of the coated cBN tool according to the embodiment of the present invention.

A coated cBN tool (surface-coated cubic boron nitride sintered material tool) according to an embodiment of the invention will be described in greater detail. As illustrated in FIG. 2, the coated cBN tool according to this embodiment is provided with a tool body 1 formed of a cBN sintered material, and a hard coating layer 2 covering a surface of the tool body 1. The hard coating layer 2 has an alternate laminated structure in which a A layer 2A formed of (Ti, Al)N and a B layer 2B formed of (Cr, Al, M)N are alternately laminated.

Cubic Boron Nitride Sintered Material (cBN Sintered Material):

Since the component composition of the cBN sintered material constituting the body 1 of the coated cBN tool according to this embodiment is regulated within a specific range, any one of the A layer 2A and the B layer 2B constituting the hard coating layer 2 having an alternate laminated structure to be described later exhibits an excellent adhesion strength. Particularly, since the adhesion strength to the A layer 2A is superior, the A layer 2A is preferable as a layer to be formed immediately on the cBN substrate (tool body) 1.

In this embodiment, the component composition of the cBN sintered material is determined as follows.

One or more of TiC, TiN, and TiCN: 10 to 50 vol %
WC: 0.1 to 2 vol %
AlN: 0.3 to 5 vol %
$TiB_2$: 2 to 10 vol %
$Al_2O_3$: 1.5 to 10 vol %
cBN (cubic boron nitride): 30 to 80 vol %

In this embodiment, the technical reason for determining the component composition of the cBN sintered material as described above is as follows.

cBN Grains:

In general, cBN grains in a cutting edge act to secure wear resistance and plastic deformation resistance. However, in a case where the content of the grains in the binder phase (cBN content in the cBN sintered material) is less than 30 vol %, the high hardness of the cBN sintered material is not sufficiently exhibited, and thus the wear resistance is significantly reduced. It is not preferable that the content of the grains is greater than 80 vol % since toughness is reduced, and thus fractures are likely to occur. In addition, the adhesion between the cBN substrate 1 and the hard coating layer 2 deteriorates, and thus abnormal wear accompanied with peeling of the hard coating layer 2 occurs and the wear resistance is reduced.

Accordingly, the content of the cBN grains is determined to be 30 to 80 vol %, and more preferably 40 to 70 vol %.

Figure 1:
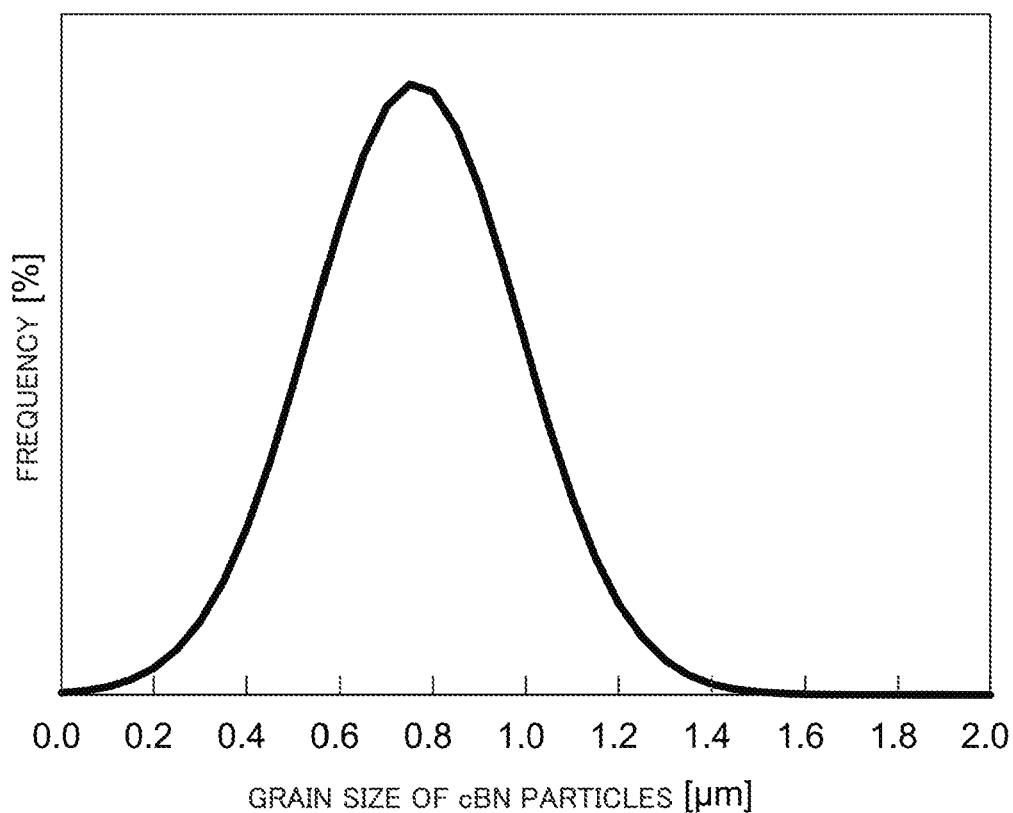
FIG. 1 illustrates an example of a grain size distribution of cBN grains in a cBN sintered material of a coated cBN tool according to an embodiment of the present invention.

In addition, when a grain size distribution of cBN grains in a cBN sintered material is measured so as to improve wear resistance of the cBN sintered material and to prevent separation of the cBN grains, it is necessary that a peak of the grain size distribution is present within a range of a grain size from 0.50 to 1.00 µm and a value of the full width at half maximum of the peak satisfies a range from 0.33 to 0.73 µm, as illustrated in FIG. 1.

As a reason therefor, if the peak of a grain size distribution is in a range less than a grain size of 0.50 µm, wear of the cBN body 1 exposed through cutting work is progressively promoted. On the other hand, if the peak of a grain size distribution is within a range exceeding a grain size of 1.00 µm, fractures are generated at interfaces between cBN grains and a binder phase in an early stage due to intermittent and impactive heavy loads acting at the time of cutting work and causing separation of the cBN grains.

In addition, if the value of the full width at half maximum of the peak becomes less than 0.33 µm, although cBN grains are uniform, the filling ratio of the cBN grains in a sintered material deteriorates. Therefore, dispersibility or reactivity with respect to the binder phase becomes inferior and toughness deteriorates, so that fractures are likely to be generated.

On the other hand, when the value of the full width at half maximum of the peak increases, fine grains and coarse grains present in a mixed manner increase. Particularly, if the value of the full width at half maximum of the peak exceeds 0.73 μm, excessively fine cBN grains and coarse cBN grains are present in a mixed manner. At this time, excessively fine cBN grains are likely to cause adsorption and incorporation of impurities such as oxygen and moisture which become hindrance to sintering. Consequently, the toughness of a cBN sintered material deteriorates. In the case of coarse cBN grains, similar to the case in which the peak of the grain size distribution is in a range exceeding 1.00 μm, fractures are likely to be generated at interfaces between cBN grains and a binder phase in an early stage due to intermittent and impactive heavy loads acting on cBN grains at the time of cutting work of the cBN grains and causing separation of the cBN grains.

Therefore, the value of the full width at half maximum of the peak in the grain size distribution of cBN grains is set within a range from 0.33 to 0.73 μm.

As a more preferable grain size distribution of cBN grains in a cBN sintered material, a grain size distribution satisfying a condition of the peak being present within a range of a grain size from 0.65 to 0.85 μm and the value of the full width at half maximum of the peak being within a range from 0.45 to 0.65 μm is employed.

The grain size distribution of cBN grains is a frequency distribution and is obtained as follows, for example.

That is, the maximum length of each of the cBN grains measured by the below-described method is set as the grain size of each of the cBN grains. A range from 0 μm to the maximum grain size is divided into ranges of a uniform grain size from 0.01 to 0.1 μm (in the example in FIG. 1, every 0.05 μm), and grain size sections are set. The ratio (%) of the number of cBN grains having the grain size within each of the grain size sections to the total number of measured cBN grains is calculated. The calculated ratio of each of the grain size sections is plotted on a graph as in FIG. 1 in which the horizontal axis indicates the grain size (μm) of cBN grains and the vertical axis indicates the frequency (%), thereby obtaining a grain size distribution.

In addition, the maximum frequency (%) in an obtained grain size distribution is set as the peak of the grain size distribution, and the width of the grain size distribution in the frequency (%) corresponding to ½ of the maximum frequency (%) is set as the full width (μm) at half maximum of the peak.

TiC, TiN, TiCN (Ti-Based Compounds)

Ti-based compounds such as TiC, TiN, and TiCN contained in the cBN sintered material act as a binder phase, and act to secure the heat resistance and the toughness of the cBN sintered material. However, in a case where the total content of TiC, TiN, and TiCN is less than 10 vol %, the toughness is significantly reduced, and the adhesion strength to the hard coating layer 2 is also reduced. In a case where the total content is greater than 50 vol %, the cBN amount is relatively reduced, and thus desired high hardness cannot be obtained, and the heat resistance is also significantly reduced.

Accordingly, the total content of these Ti-based compounds is determined to be 10 to 50 vol %.

The total content of these Ti-based compounds (TiC, TiN, TiCN) is preferably 20 to 40 vol %. In addition, the average grain size of these Ti-based compounds is preferably 1 μm or less, and more preferably 0.2 to 0.7 μm in consideration of dispersibility in the cBN sintered material.

WC, $TiB_2$, AlN, $Al_2O_3$ (Dispersion Components)

Dispersion components such as WC, $TiB_2$, AlN, and $Al_2O_3$ contained in the cBN sintered material are all components dispersed as hard dispersion phases in the binder phase formed of a Ti-based compound, and act to suppress the grain growth of the Ti-based compound. In a case where WC is less than 0.1 vol %, $TiB_2$ is less than 2 vol %, AlN is less than 0.3 vol %, and $Al_2O_3$ is less than 1.5 vol %, the effect of suppressing the grain growth of the Ti-based compound is small. In a case where WC is greater than 2 vol %, $TiB_2$ is greater than 10 vol %, AlN is greater than 5 vol %, and $Al_2O_3$ is greater than 10 vol %, the sinterability of the cBN sintered material is reduced, the strength is reduced, and the adhesion strength to the hard coating layer 2 is also reduced.

In addition to the above-described actions, in a case where $TiB_2$ is less than 2 vol %, the strength is significantly reduced at high temperatures, and in a case where $TiB_2$ is greater than 10 vol %, the strength and the toughness are significantly reduced even in a temperature region which is not so high. In addition, in a case where AlN is less than 0.3 vol %, the sintered material is not likely to be dense, and in a case where AlN is greater than 5 vol %, the strength and the toughness are significantly reduced. Moreover, in a case where $Al_2O_3$ is less than 1.5 vol %, the wear resistance and the heat resistance are significantly reduced, and in a case where $Al_2O_3$ is greater than 10 vol %, the toughness is significantly reduced.

Accordingly, a reduction in the sinterability and in the strength of the cBN sintered material can be suppressed by adjusting the content of each dispersion component in the cBN sintered material to the above-described specific amount. At the same time, since the effect of suppressing the grain growth of the Ti-based compound in the cBN sintered material can be exhibited, the adhesion strength to the hard coating layer 2 can be further improved.

Accordingly, the contents of the dispersion components are determined as follows: 0.1 to 2 vol % of WC; 2 to 10 vol % of $TiB_2$; 0.3 to 5 vol % of AlN; and 1.5 to 10 vol % of $Al_2O_3$.

The ranges of these dispersion components are preferably as follows: 0.3 to 1.5 vol % of WC; 3 to 7 vol % of $TiB_2$; 1 to 4 vol % of AlN; and 2 to 9 vol % of $Al_2O_3$.

The grain sizes of these dispersion components in the matrix are all preferably 0.5 μm or less, and preferably 0.3 μm or less in terms of average grain size. From the viewpoint of manufacturability, it is desirable that the lower limit value for the average grain size be set to 0.1 μm.

The average grain sizes of the cBN grains, the Ti-based compounds (TiC, TiN, TiCN), and the dispersion components (WC, $TiB_2$, AlN, $Al_2O_3$) in the cBN sintered material can be measured and obtained by, for example, the following method.

Regarding the cBN grains, a cross-sectional structure (in the tool body 1, a structure of a cross section vertical to the surface of the tool body 1) of a produced cBN sintered material is observed by a scanning electron microscope (scanning electron microscopy: SEM), and a secondary electron image is obtained. In the obtained image, cBN grain portions are extracted by an image process, and a maximum length of each cBN grain is obtained by image analysis and defined as a diameter of each cBN grain. Based on the volumes of the respective cBN grains calculated and obtained from the diameters by assuming that the grains are spheres, a graph having a vertical axis representing a volume percentage (vol %) and a horizontal axis representing a diameter (μm) is drawn. Here, the volume percentage is a ratio of an integrated value of the volumes of the respective cBN grains with respect to the sum of the volumes of all the cBN grains. The integrated value of the volumes is the sum of the volumes of the respective cBN grains and the volumes of the cBN grains having a diameter which is not greater than the diameters of the above cBN grains. A diameter (median diameter) in which the volume percentage is 50 vol % is defined as a grain size of the cBN grains in the secondary electron image. The average of the values (grain sizes of the cBN grains in the respective secondary electron images) obtained by processing at least three secondary electron images obtained by SEM at a magnification of 5,000 times is defined as an average grain size (μm) of the cBN grains.

Regarding the grains of the Ti-based compounds and the dispersion components, a cross-sectional structure of a produced cBN sintered material is observed using Auger electron spectroscopy (AES) to observe each binder phase structure of the cBN sintered material, and elemental mapping images of the constituent elements are obtained. For example, elemental mapping images of Al and O are obtained in obtaining an average grain size of $Al_2O_3$. Overlapping portions of the obtained elemental mapping images are analyzed by image analysis, and grains of the Ti-based compounds and the dispersion components are extracted by an image process. A maximum length of each of the grains of the Ti-based compounds and the dispersion components is obtained by image analysis and defined as a diameter of each of the grains of the Ti-based compounds and the dispersion components. Similarly to the case of the cBN grains, based on the volumes of the respective grains calculated and obtained from the diameters, a graph having a vertical axis representing a volume percentage (vol %) and a horizontal axis representing a diameter (μm) is drawn. This graph is drawn individually for each of the Ti-based compounds and the dispersion components. A diameter (median diameter) in which the volume percentage obtained from each graph is 50 vol % is defined as a grain size of the grains of each of the Ti-based compounds and the dispersion components in the images obtained by AES. The average of the values (grain sizes of each of the Ti-based compounds and the dispersion components in the respective images) obtained by processing at least three elemental mapping images obtained by AES at a magnification of 20,000 times is defined as an average grain size (μm) of the grains of each of the Ti-based compounds and the dispersion components.

A layer Constituting Alternate Laminated Structure of Hard Coating Layer:

FIG. 2 illustrates a schematic vertical cross-sectional view of the hard coating layer 2 of the coated tool according to this embodiment. The complex nitride layer of Ti and Al (hereinafter, may also be simply indicated by "(Ti, Al)N layer") itself constituting the A layer 2A of the hard coating layer 2 having an alternate laminated structure has an excellent high-temperature strength. In addition, the A layer 2A has an excellent adhesion strength to the cBN substrate 1, and also has an excellent adhesion strength to the B layer 2B constituting the alternate lamination. Therefore, by virtue of the formation of the hard coating layer 2 having an alternate laminated structure of A layer 2A and B layer 2B, the interlayer adhesion strength between the A layer and the B layer can be increased, and as a result, the fracture resistance and the peeling resistance can be improved with no reduction in the wear resistance.

However, in a case where the composition of (Ti, Al)N of the A layer 2A is represented by a composition formula $(Ti_{1-x}Al_x)N$, and in a case where x (atomic ratio) representing the content ratio of Al is less than 0.4, the high-temperature hardness is reduced, and this leads to a deterioration in the wear resistance. In addition, in a case where x (atomic ratio) is greater than 0.7, the content ratio of Ti is relatively reduced, and thus a sufficient high-temperature strength cannot be secured, and the hardness is reduced due to the appearance of crystal grains having a hexagonal structure. As a result, the wear resistance is reduced. Accordingly, x (atomic ratio) representing the content ratio of Al in the A layer 2A is determined to be 0.4 to 0.7. x (atomic ratio) representing the content ratio of Al in the A layer 2A is preferably 0.5 to 0.7.

B layer Constituting Alternate Laminated Structure of Hard Coating Layer:

In the complex nitride layer of Cr, Al, and M (hereinafter, may also be simply indicated by "(Cr, Al, M)N layer") constituting the B layer 2B, Cr which is a main component of the B layer 2B improves the high-temperature strength, thereby improving the fracture resistance of the hard coating layer 2. In addition, due to the Cr component and the Al component contained in a coexistent manner, the B layer 2B has high-temperature oxidation resistance in regard to high heat generated in high-speed cutting, and functions as a layer which reduces an intermittent and impact high load acting on the hard coating layer 2 in strong intermittent cutting.

However, in a case where the composition of (Cr, Al, M)N layer as the B layer 2B is represented by a composition formula $(Cr_{1-y-z}Al_yM_z)N$, and in a case where y (atomic ratio) representing the content ratio of Al is greater than 0.6, the hardness is increased, but lattice distortion increases, and thus the fracture resistance is reduced. In a case where y (atomic ratio) is less than 0.03, the wear resistance is reduced. Accordingly, y (atomic ratio) is 0.03 to 0.6. y (atomic ratio) is preferably 0.2 to 0.5.

In addition, the component M represents one or more elements selected from group 4a elements, group5a elements, and group 6a elements in the periodic table excluding Cr, B, and Si. In a case where z (atomic ratio) representing the total content ratio of the component M is greater than 0.05, lattice distortion increases, and thus the fracture resistance is reduced. Accordingly, z (atomic ratio) is 0 to 0.05.

Specific examples of the component M include Zr, Ti, V, Nb, Mo, W, B, and Si. Among the components M, Zr acts to improve heat-resistant plastic deformability, Ti acts to improve high-temperature hardness, V acts to image lubricity, Nb acts to improve high-temperature wear resistance, Mo acts to improve welding resistance, W acts to improve heat radiation, B acts to increase film hardness and to improve lubricity, and Si acts to improve heat resistance. As described above, in a case where z (atomic ratio) representing the total content ratio of the component M is greater than 0.05, the fracture resistance of the B layer is reduced due to increasing lattice distortion. Accordingly, the upper limit of the total content ratio of the component M is 0.05.

Alternate Lamination of A Layer and B Layer:

The average single layer thickness of each of the A layer 2A and the B layer 2B constituting the alternate laminated structure is 0.1 to 3.0 μm. Here, the average single layer thickness of the A layer 2A is an average of the layer thicknesses of the A layers 2A, and the average single layer thickness of the B layer 2B is an average of the layer thicknesses of the B layers 2B.

In a case where the average layer thickness of the A layers 2A is less than 0.1 μm, the effect of improving the adhesion strength to the tool body 1 or the B layer 2B is reduced. In a case where the average layer thickness of the A layers 2A is greater than 3.0 μm, cracks are likely to occur due to the accumulation of residual compressive stress, and thus no stable adhesion force can be secured. Therefore, the average single layer thickness of the A layer is determined to be 0.1 to 3.0 μm, and preferably 0.3 to 2.0 μm. More preferably, the layer thickness of each A layer 2A is within a range of 0.1 to 3.0 μm, but is not limited thereto.

In addition, in a case where the average layer thickness of the B layers 2B is less than 0.1 μm, excellent wear resistance cannot be exhibited for long-term use. In a case where the average layer thickness is greater than 3.0 μm, chipping or fracture is likely to occur. Therefore, the average layer thickness of the B layers is determined to be 0.1 to 3.0 μm, and preferably 0.3 to 2.0 μm. More preferably, the layer thickness of each B layer 2B is within a range of 0.1 to 3.0 μm, but is not limited thereto.

In addition, in a case where the total layer thickness of the hard coating layer 2 having an alternate laminated structure is less than 0.5 μm, sufficient wear resistance cannot be exhibited for a long period of time. In a case where the total layer thickness is greater than 4.0 μm, the hard coating layer 2 is likely to self-collapse. Therefore, the total layer thickness of the hard coating layer 2 is 0.5 to 4.0 μm.

In constituting the alternate laminated structure formed of A layer 2A and B layer 2B, by forming the A layer 2A immediately on the surface of the cBN substrate 1, the adhesion strength between the tool body 1 and the hard coating layer 2 can be further increased. In addition, by forming the B layer 2B as an outermost surface of the hard coating layer 2, an intermittent and impact high load acting during strong intermittent cutting can be effectively reduced, and thus the fracture resistance can be further improved. Accordingly, in constituting the alternate laminated structure, the A layer 2A is preferably formed immediately on the surface of the cBN substrate 1 and the B layer 2B is preferably formed as the outermost surface of the hard coating layer 2.

The compositions and the average single layer thicknesses of the A layer 2A and the B layer 2B, and the total layer thickness of the hard coating layer 2 can be measured by performing cross section measurement on a vertical section of the hard coating layer 2 vertical to the surface of the cBN substrate 1 using a scanning electron microscope (scanning electron microscopy: SEM), a transmission electron microscope (TEM), and energy dispersive X-ray spectroscopy (EDS).

Figure 3:
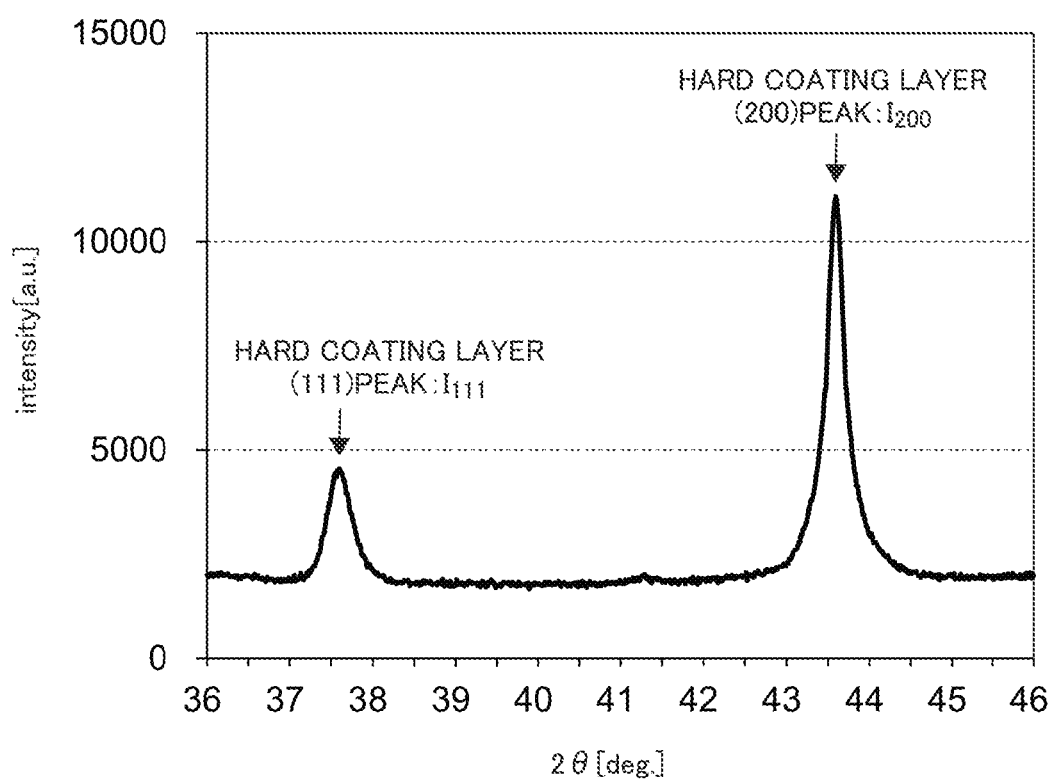
FIG. 3 illustrates an example of an X-ray diffraction chart of a measurement with respect to a hard coating layer of the coated cBN tool according to the embodiment of the present invention.

X-ray diffraction for entirety of hard coating layer constituted of A layer and B layer:

As illustrated in FIG. 3, when an X-ray diffraction measurement is performed for crystal grains constituting the entirety of the hard coating layer 2 constituted of the A layer 2A and the B layer 2B of the present embodiment and a diffraction peak $I_{200}$ of a (200) plane is obtained, the diffraction peak $I_{200}$ of the (200) plane is observed at a position where a diffraction angle (2θ) indicates 43.6±0.1 degrees. In addition, a diffraction peak $I_{111}$ of a (111) plane is also observed near the diffraction angle (2θ) of 37.5 degrees. In the X-ray diffraction measurement of the present embodiment, the surface of the hard coating layer 2 is irradiated with X-rays to measure the intensity of diffraction X-rays, thereby obtaining an X-ray diffraction pattern as in FIG. 3.

If the diffraction angle (2θ) of the diffraction peak $I_{200}$ of the (200) plane becomes smaller than 43.5 degrees, internal compressive stress of the hard coating layer 2 excessively increases. Particularly, self-collapse is likely to be caused due to intermittent and impactive heavy loads acting at the time of cutting work. On the other hand, if the diffraction angle (2θ) becomes smaller than 43.7 degrees, internal compressive stress of the hard coating layer 2 is not sufficient. Therefore, an effect of suppressing generation of fractures is not exhibited.

Therefore, when X-ray diffraction is performed for the hard coating layer 2 in its entirety, it is necessary for a diffraction peak of the (200) plane to be present at a position where the diffraction angle (2θ) indicates 43.6±0.1 degrees, in order to improve fracture resistance.

When an ordinary cBN body (for example, a cBN body which contains cBN grains of 60 vol % and is constituted of the balance of a binder phase of Ti compounds, the dispersion terms of WC, $TiB_2$, AlN, $Al_2O_3$, and the like) is coated with a single layer of a (Al, Cr, Si, Cu)N layer, and X-ray diffraction is performed for the layer, the diffraction peak of the (200) plane is observed near 44 degrees. Accordingly, it is possible to ascertain that a crystal lattice is in a relatively stretched state in the hard coating layer 2 of the present embodiment, and as a result, an effect of suppressing generation of fractures is exhibited when intermittent and impactive loads act on the hard coating layer 2.

In addition, in a measured X-ray diffraction pattern, when the full width at half maximum is measured for the diffraction peak of the (200) plane $I_{200}$ present at a position of 43.6±0.1 degrees, if the full width at half maximum becomes smaller than 0.2 degrees, it is not possible to sufficiently resist intermittent and impactive loads acting from the outside at the time of cutting work. Therefore, an effect of suppressing generation of fractures is not exhibited. On the other hand, if the full width at half maximum becomes greater than 0.3 degrees, crystallinity of the hard coating layer 2 deteriorates or defects are generated inside the hard coating layer 2. Therefore, fractures are likely to be generated first in the hard coating layer 2 due to intermittent and impactive loads acting at the time of cutting work.

Therefore, the full width at half maximum needs to be 0.25±0.05 degrees.

In the deposition step described below, it is possible to obtain the hard coating layer 2 having the diffraction peak of the (200) plane and the full width at half maximum thereof by depositing the A layer 2A and the B layer 2B in the conditions shown in a deposition step (c).

Figure 5:
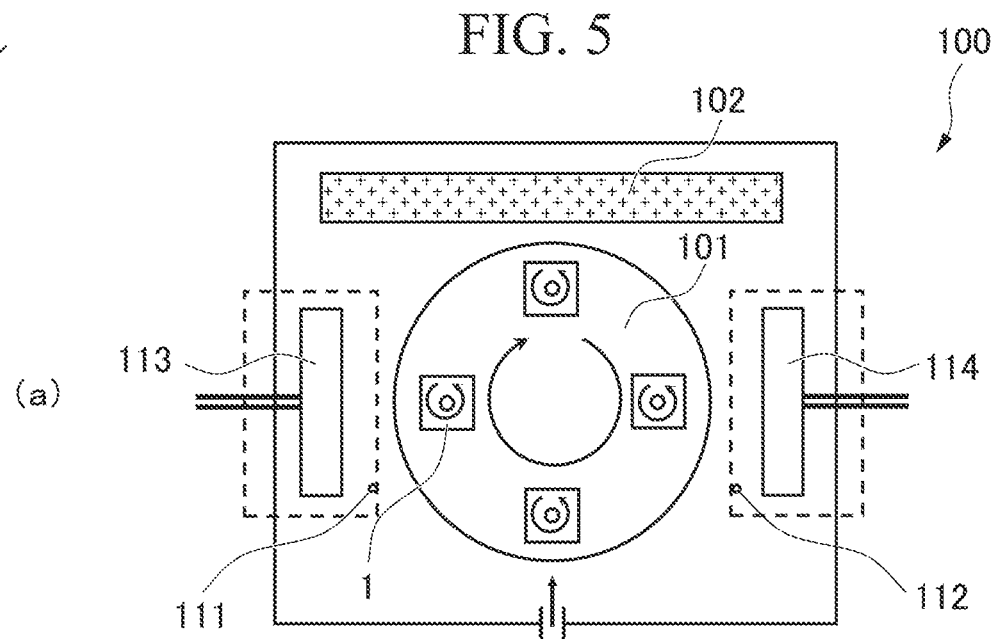
FIG. 5 illustrates an arc ion plating apparatus which is used to form a hard coating layer. (a) of FIG. 5 is a schematic plan view, and (b) of FIG. 5 is a schematic front view.
Figure 5:
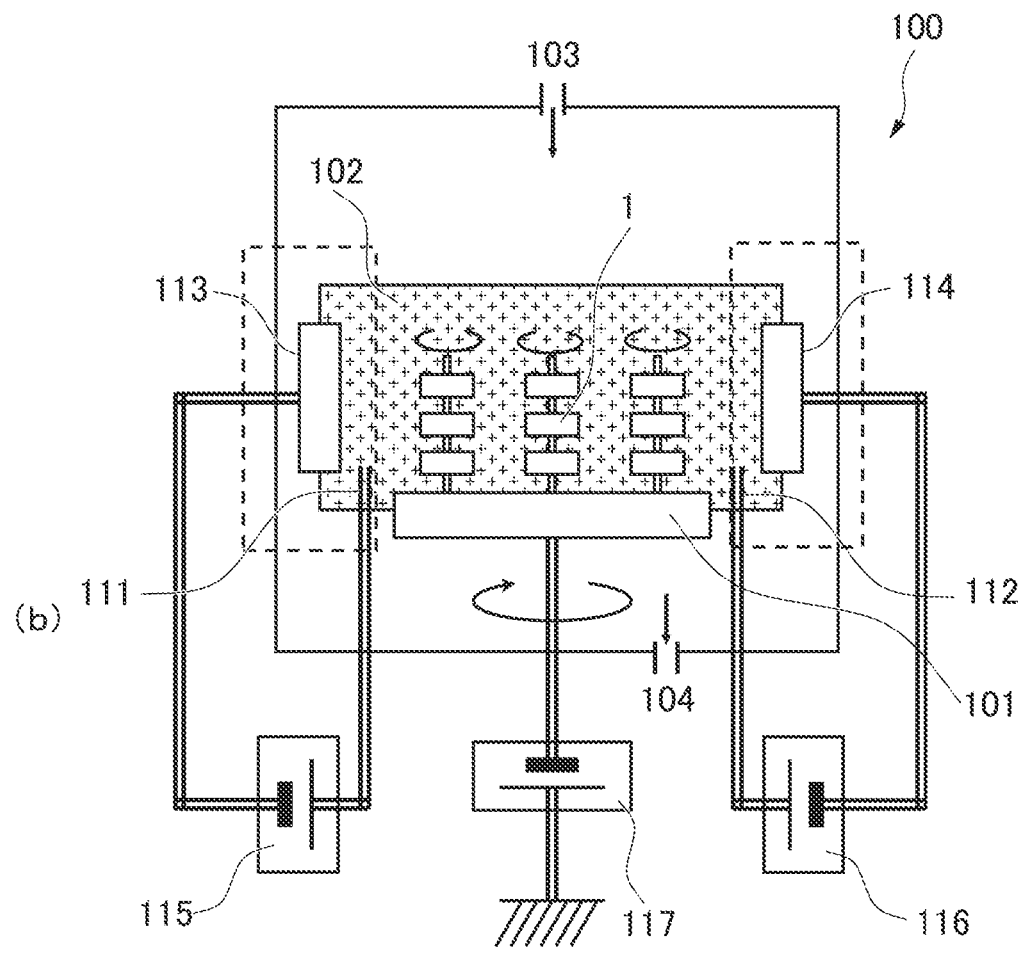

Deposition Step:

The hard coating layer 2 is deposited on the tool body 1 constituted of the cBN sintered material of the present embodiment described above using an arc ion plating apparatus 100 illustrated in FIG. 5. The arc ion plating apparatus 100 includes a rotation table 101 for placing the tool body 1 (cBN bodies 1 to 12), a heater 102 for heating the tool body 1, a reaction gas inlet 103 for introducing reaction gas, an exhaust gas outlet 104 for discharging gas out of a system, two anode electrodes 111 and 112, and two cathode electrodes 113 and 114. The anode electrode 111 and the cathode electrode 113 are connected to an arc electric power supply 115 outside the apparatus 100. The anode electrode 112 and the cathode electrode 114 are connected to an arc electric power supply 116 outside the apparatus 100. The rotation table 101 is connected to a bias electric power supply 117 outside the apparatus 100. For example, the cathode electrode 113 is a target constituted of a Ti—Al alloy for forming an A layer 2A, and the cathode electrode 114 is a target constituted of a Cr—Al—M alloy for forming a B layer 2B.

(a) In a state in which the tool body 1 is subjected to ultrasonic cleaning in acetone and is dried, the tool body 1 is mounted along an outer peripheral part of the rotation table 101 at a position away from a rotation center axis on the rotation table 101 inside the arc ion plating apparatus 100 by a predetermined distance in a radial direction.

(b) First, while a vacuum state of $10^{-2}$ Pa or lower is retained after gas inside the apparatus 100 is discharged, the inside of the apparatus is heated to 450° C. or higher (for example, 500° C.) using the heater 102. Thereafter, an Ar gas atmosphere ranging from 0.5 to 2.0 Pa is set inside the apparatus 100, and a direct-current bias voltage ranging from -200 to -1,000 V is applied to the tool body 1 which rotates while turning on its axis on the rotation table 101. Then, the surface of the tool body 1 is subjected to bombardment treatment with argon ion for 5 to 60 minutes.

(c) Subsequently, the A layer 2A and the B layer 2B of the hard coating layer are formed as follows.

First, nitrogen gas as reaction gas is introduced into the apparatus 100 to realize a reaction atmosphere of a pressure within a range from 2 to 10 Pa, and the temperature inside the apparatus 100 is maintained within a range from 400° C. to 600° C. In addition, the rotational frequency of the rotation table 101 is controlled to be within a range from 1.5 to 3.0 rpm, a direct-current bias voltage within a range from -10 to -75 V is applied to the tool body 1 which rotates while turning on its axis on the rotation table 101, and an arc discharge is generated by causing a current within a range from 90 to 200 A to flow between the cathode electrode (evaporation source) 113 for forming an A layer 2A, and the anode electrode 111. Accordingly, the A layer 2A is formed. Subsequently, an arc discharge is generated by causing a predetermined current within the same range from 90 to 200 A to flow between the cathode electrode (evaporation source) 114 for forming a B layer 2B, and the anode electrode 112. Accordingly, the B layer 2B is formed. The steps described above are performed one at a time or are repetitively performed a plurality of times, so that the hard coating layer 2 constituted of an alternate laminated structure of the A layer 2A and the B layer 2B individually having a target composition and a target average layer thickness of one layer is deposited on the surface of the tool body 1, and thus, a coated cBN tool including the hard coating layer 2 is produced.

Plastic Deformation Work Ratio $W_{plast}/(W_{plast}+W_{elast})$ of B Layer:

In order to confirm the relaxation of a high load acting on a cutting edge during cutting by the B layer 2B of the hard coating layer 2 according to this embodiment, a nano-indentation test was performed with a load set such that an indentation depth is not greater than 1/10 of the layer thickness of the B layer 2B positioned on the outermost surface of the hard coating layer 2, and the hardness and the plastic deformation work ratio $W_{plast}/(W_{plast}+W_{elast})$ of the B layer 2B were obtained. The hardness (nano-indentation hardness) of the B layer 2B was confirmed to be within a range of 28 to 42 GPa, and the value of the plastic deformation work ratio $W_{plast}/(W_{plast}+W_{elast})$ was confirmed to be within a range of 0.35 to 0.50.

Figure 4A:
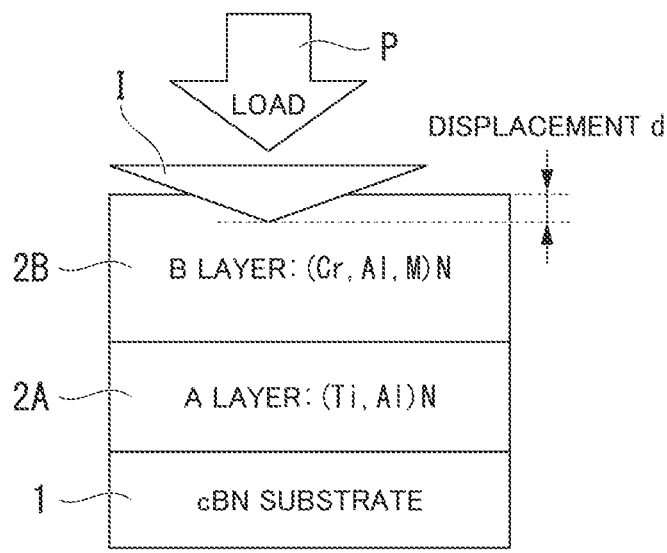
FIG. 4A is a schematic view for illustrating obtaining a plastic deformation work ratio, and for illustrating a test method.
Figure 4B:
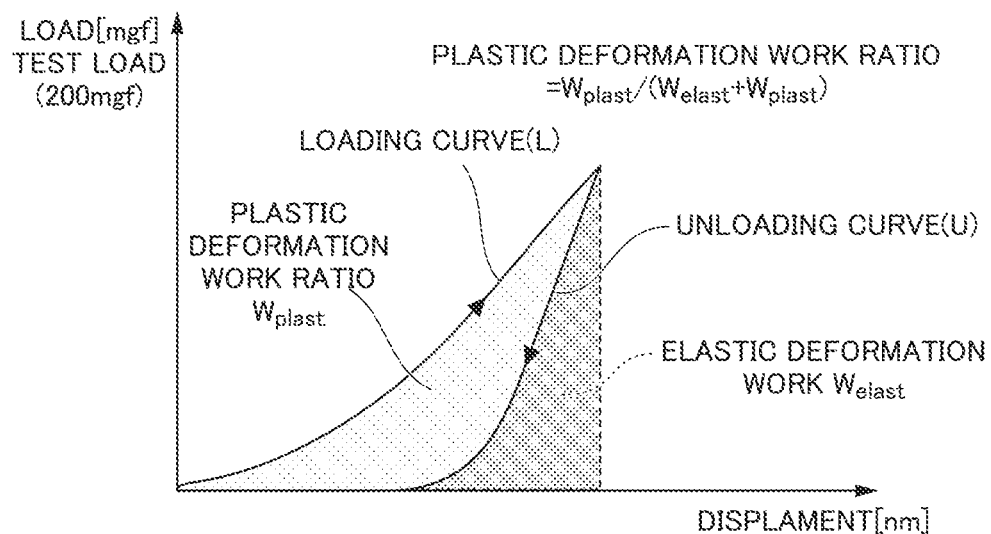
FIG. 4B is a schematic view for illustrating obtaining a plastic deformation work ratio, and for illustrating a displacement-load loading curve and a displacement-load unloading curve obtained by the test.

The plastic deformation work ratio $W_{plast}/(W_{plast}+W_{elast})$ is calculated as illustrated in the schematic views of FIGS. 4A and 4B. Specifically, an indenter I is disposed on a surface of the B layer which is an outermost surface of the hard coating layer 2, and a load P is applied to the indenter I such that an indentation depth is not greater than 1/10 of the layer thickness of the B layer 2B, thereby displacing the surface of the B layer 2B (see FIG. 4A). From a displacement d and the load P at that time, a displacement-load loading curve L is obtained (see FIG. 4B), and then the load P is removed to obtain a displacement-load unloading curve U (see FIG. 4B). Plastic deformation work $W_{plast}$ and elastic deformation work $W_{elast}$ are obtained from a difference between the loading curve L and the unloading curve U. Specifically, in the loading curve L and the unloading curve U drawn to have a vertical axis representing the load P (mgf) and a horizontal axis representing the displacement d (nm), the area of a region surrounded by the loading curve L, the unloading curve U, and the horizontal axis is the plastic deformation work $W_{plast}$, and the area of a region surrounded by the unloading curve U, the horizontal axis, and the line (dotted line in FIG. 4B) which intersects the horizontal axis and is parallel to the vertical axis at a maximum value of the displacement d is the elastic deformation work $W_{elast}$. From these values, the plastic deformation work ratio $W_{plast}/(W_{plast}+W_{elast})$ can be calculated.

In a case where the plastic deformation work ratio $W_{plast}/(W_{plast}+W_{elast})$ is within a range of 0.35 to 0.50, the B layer can have an impact relaxation property with no reduction in the plastic deformation resistance, and thus excellent fracture resistance is exhibited even under strong intermittent cutting conditions.

In a case where the plastic deformation work ratio $W_{plast}/(W_{plast}+W_{elast})$ is less than 0.35, a sufficient impact relaxation property is not obtained, and thus sufficient fracture resistance cannot be obtained under strong intermittent cutting high conditions. In a case where the plastic deformation work ratio is greater than 0.50, the plastic deformation resistance is reduced, and there is a tendency that the wear resistance is reduced. Accordingly, the plastic deformation work ratio $W_{plast}/(W_{plast}+W_{elast})$ is 0.35 to 0.50.

In the above-described deposition step of the hard coating layer 2, in a case where a bias voltage within a range of -10 to -75 V is applied to the tool body 1, and a predetermined electric current within a range of 100 to 200 A is allowed to flow between the cathode electrode 114 (evaporation source) and the anode electrode 112 for forming a B layer to generate arc discharge and to thus deposit a B layer 2B, a B layer 2B having the above-described plastic deformation work ratio is obtained.

Next, the coated cBN tool according to this embodiment will be described in detail with examples.

EXAMPLES

Production of cBN Substrate:

As a raw material powder, a cBN powder having an average grain size within a range of 0.5 to 1.5 μm was prepared as a raw material powder for hard phase formation, and likewise, one or more of a TiC powder, a TiN powder, and a TiCN powder having an average grain size of 1 μm or less were prepared as a raw material powder for binder phase formation. Likewise, a WC powder, an AlN powder, a $TiB_2$ powder, and an $Al_2O_3$ powder having an average grain size of 1 μm or less were prepared as a raw material powder for dispersion component formation.

The cBN powder, the raw material powder for binder phase formation, and the raw material powder for dispersion component formation were blended at a predetermined blending ratio.

Next, the raw material powders were wet-mixed for 72 hours by a ball mill and dried. Then, the mixture was subjected to press molding into dimensions of 50 mm in diameter and 1.5 mm in thickness at a molding pressure of 120 MPa to obtain a molded body. The molded body was held and temporarily sintered at a predetermined temperature of 900° C. to 1300° C. in a vacuum atmosphere with a pressure of $1\times10^{-4}$ Pa or less, and then set in an ultra-high pressure sintering apparatus and subjected to ultra-high pressure sintering under conditions of pressure: 5 GPa, temperature: 1200° C. to 1400° C., and 30 min of holding time. Accordingly, cBN sintered materials 1 to 12 according to this embodiment shown in Table 1 were produced.

Regarding the cBN sintered materials 1 to 12 produced as described above, vertical sections thereof were observed by the following method, and volume ratios and average grain sizes of cBN grains, binder phase components, and dispersion components were measured and calculated by the following method.

Measurement and Calculation of Volume Ratio:

Regarding the content (volume %) of the cBN grains in the cBN sintered material, a cross-sectional structure of a produced cBN sintered material was observed by a scanning electron microscope (scanning electron microscopy: SEM). In the obtained secondary electron image, cBN grain portions were extracted by an image process using an image processing software (WinROOF), and an area occupied by the cBN grains was calculated by image analysis. The calculated value was divided by a total image area to calculate an area ratio. The area ratio was regarded as volume %, and the content (volume %) of the cBN grains in the secondary electron image was obtained. The average of the values (area ratios in the respective secondary electron images) obtained by processing at least three secondary electron images obtained by SEM at a magnification of 5,000 times was defined as a content (volume %: vol %) of the cBN grains. A visual field area of approximately 20 μm×20 μm is preferable as an observation region to be used in the image process. In this example, the content (volume ratio) of the cBN grains was obtained from three images in which three regions having a size of 20 μm×20 μm were observed.

Regarding the contents (volume %) of the binder phase components and the dispersion components in the cBN sintered material, a cross-sectional structure of a produced cBN sintered material was observed using Auger electron spectroscopy (AES) to observe each binder phase structure of the cBN sintered material, and elemental mapping images of the constituent elements of each binder phase structure were obtained. For example, in a case of $Al_2O_3$, elemental mapping images of Al and O were obtained. Overlapping portions of the obtained elemental mapping images were analyzed by image analysis, and grains of the binder phase components and the dispersion components were extracted by an image process. An area occupied by the grains of the binder phase component and an area occupied by the grains of the dispersion component were calculated by image analysis. The calculated values were divided by a total image area to calculate an area ratio of each of the binder phase components and the dispersion components. The area ratio was regarded as volume %, and the content (volume %) of the grains of each of the binder phase components and the dispersion components in the images obtained by AES was obtained. The average of the values (area ratios of the grains of each of the binder phase components and the dispersion components in the respective images) obtained by processing at least three elemental mapping images obtained by AES at a magnification of 20,000 times was defined as a content (volume %: vol %) of the grains of each of the binder phase components and the dispersion components. A visual field area of approximately 5 μm×5 μm is preferable as an observation region to be used in the image process. In this example, the content (volume ratio) of the grains of each of the binder phase components and the dispersion components was obtained from three images in which three regions having a size of 5 μm×5 μm were observed.

Measurement and Calculation of Average Grain Diameter:

Regarding the average grain size of the cBN grains, a cross-sectional structure of a produced cBN sintered material was observed by a scanning electron microscope (scanning electron microscopy: SEM), and a secondary electron image was obtained. In the obtained image, cBN grain portions were extracted by an image process using the image processing software (WinROOF), and a maximum length of each cBN grain was obtained by image analysis and defined as a diameter of each cBN grain. Based on the volumes of the respective cBN grains calculated and obtained from the diameters by assuming that the cBN grains were spheres, a graph having a vertical axis representing a volume percentage (vol %) and a horizontal axis representing a diameter (μm) was drawn. A diameter in which the volume percentage was 50 vol % was defined as a grain size of the cBN grains in the secondary electron image. The average of the values obtained by processing at least three secondary electron images obtained by SEM at a magnification of 5,000 times was defined as an average grain size (μm) of the cBN grains. In addition, the maximum length of each of the cBN grains obtained from three regions having the size of 20 μm=20 μm was set as the grain size of each of the cBN grains, and the grain size distribution of the cBN grains was obtained as described above.

Regarding the average grain sizes of the grains of the Ti-based compounds (binder phase components) and the dispersion components, a cross-sectional structure of a produced cBN sintered material was observed using Auger electron spectroscopy (AES) to observe each binder phase structure of the cBN sintered material, and elemental mapping images of the constituent elements were obtained. For example, in a case of $Al_2O_3$, elemental mapping images of Al and O were obtained. Overlapping portions of the obtained elemental mapping images were analyzed by image analysis using the image processing software (WinROOF), and grains of the Ti-based compounds and the dispersion components were extracted by an image process. A maximum length of each of the grains of the Ti-based compounds and the dispersion components was obtained by image analysis and defined as a diameter of each of the grains of the Ti-based compounds and the dispersion components. Similarly to the case of the cBN grains, based on the volumes of the respective grains calculated and obtained from the diameters, a graph having a vertical axis representing a volume percentage (vol %) and a horizontal axis representing a diameter (μm) was drawn. This graph was drawn individually for each of the Ti-based compounds and the dispersion components. A diameter in which the volume percentage was 50 vol % was defined as a grain size of the grains of each of the Ti-based compounds and the dispersion components in the images obtained by AES. The average of the values obtained by processing at least three elemental mapping images obtained by AES at a magnification of 20,000 times was defined as an average grain size (μm) of the grains of each of the Ti-based compounds and the dispersion components. In this example, the average grain size of the grains of each of the binder phase components and the dispersion components was obtained from three images in which three regions having a size of 5 μm×5 μm were observed.

Table 1 shows the values of the volume ratios and the average grain sizes of the cBN grains, the binder phase components, and the dispersion components obtained in regard to the cBN sintered materials 1 to 12.

For the cBN grains, Table 3 shows the peak values in the grain size distribution and the values of the full width at half maximum in the peak value. Here, the peak value (the grain size indicating the peak) in the grain size distribution was obtained by obtaining the regression curve of the grain size distribution in a Gaussian function form and calculating the grain size applying the maximum value of this regression curve.

Each of the cBN sintered materials 1 to 12 was cut into predetermined dimensions by a wire-electrical discharge machine and brazed to a brazing portion (corner portion) of an insert body made of WC-based cemented carbide having a composition including 5 mass % of Co, 5 mass % of TaC, and the balance WC and having an insert shape of ISO-standards CNGA120408 by using an Ag alloy-based brazing material having a composition including 26 mass % of Cu, 5 mass % of Ti, and the balance Ag in terms of mass %. By performing polishing on upper and lower surfaces and on an outer periphery, and performing a honing treatment, cBN bodies 1 to 12 according to this embodiment having an insert shape of ISO-standards CNGA120408 were manufactured.

Formation of Hard Coating Layer:

A hard coating layer was formed on each of the cBN bodies 1 to 12 according to this embodiment using an arc ion plating apparatus 100 illustrated in FIG. 5. In this example, a target formed of a Ti—Al alloy having a composition shown in Table 2 was used as the cathode electrode 113 (evaporation source), and a target formed of a Cr—Al—M alloy having a composition shown in Table2 was used as the cathode electrode 114 (evaporation source). Using such an arc ion plating apparatus 100, a hard coating layer was formed on a body surface of each of the cBN bodies 1 to 12 in accordance with the following procedures.

(a) The tool bodies 1 (cBN bodies 1 to 12) were subjected to ultrasonic cleaning in acetone. In a state of being dried, the tool bodies were mounted along the outer peripheral portion of the rotation table 101 at positions separated by a predetermined distance from a rotation central axis on the rotation table 101 in the arc ion plating apparatus 100 in a radial direction, respectively.

(b) First, while the apparatus 100 was evacuated to be held in vacuum of $10^{-2}$ Pa or less, the heater 102 heated the inside of the apparatus 100 to 450° C. or higher. After that, the inside of the apparatus 100 was set to be in an Ar gas atmosphere of 0.5 to 2.0 Pa, a direct current bias voltage of −200 to −1,000 V (more specifically, 250 V) was applied to the tool bodies 1 revolving and rotating on the rotation table 101, and surfaces of the tool bodies 1 (cBN bodies 1 to 12) were subjected to a bombardment treatment for 10 to 60 minutes (more specifically, 60 minutes) by argon ions.

(c) Next, a hard coating layer having an alternate laminated structure was formed as follows.

(c-1) Formation of A Layer:

First, a nitrogen gas as a reaction gas was introduced into the apparatus 100 to provide a predetermined reaction atmosphere with a pressure of 2 to 10 Pa shown in Table 2, and the temperature in the apparatus 100 was maintained at a temperature shown in Table2. Likewise, the rotation speed of the rotation table 101 was controlled to be a rotation speed shown in Table2, a predetermined direct current bias voltage of −10 to −75 V shown in Table2 was applied to the tool bodies 1 (cBN bodies 1 to 12) revolving and rotating on the rotation table 101, and a predetermined arc current of 100 to 200 A shown in Table2 was allowed to flow between the cathode electrode (evaporation source) 113 and the anode electrode 111 for forming an A layer to generate arc discharge. Accordingly, an A layer was formed.

(c-2) Formation of B Layer:

Next, the pressure of nitrogen gas inside the apparatus 100 was set to the value shown in Table2, a predetermined direct-current bias voltage within a range from −10 to −75 V shown in Table2 was applied to the tool body 1 (cBN bodies 1 to 12), and an arc discharge was generated by causing a predetermined arc current within a range from 100 to 200 A shown in Table2 to flow between the cathode electrode (evaporation source) 114 for forming a B layer, and the anode electrode 112. Accordingly, a B layer was formed.

(c-3) Formation of Alternate Laminated Structure:

The steps (c-1) and (c-2) were performed once, respectively, or repeatedly performed multiple times to deposit, on each of the surfaces of the tool bodies 1 (cBN bodies 1 to 12), a hard coating layer having an alternate laminated structure of A layer and B layer with a target composition and a one-layer target average layer thickness shown in Table3. The hard coating layer was formed such that the A layer was positioned on a surface of the tool body 1, and the B layer was positioned on an outermost surface of the hard coating layer. In this manner, invention coated cBN tools (hereinafter, referred to as "Tools of Examples of the present invention") 1 to 12 shown in Table3 were produced.

All of the compositions in the type of the cathode electrode (target) for forming an A layer and the type of the cathode electrode (target) for forming a B layer in Table2 are based on an atomic ratio.

For comparison, cBN grains having a predetermined average grain size, a raw material powder for forming a binder phase component, and a raw material powder for forming a dispersion component were blended at a predetermined blending ratio, and the mixture was sintered in the same manner as in the examples (Tools of Examples of the present invention) to produce cBN sintered materials 21 to 32 of comparative examples shown in Table4. These were further processed in the same manner as in the examples (Tools of Examples of the present invention), and thus cBN bodies 21 to 38 of the comparative examples were produced.

A hard coating layer having an alternate laminated structure of A layer and B layer was deposited on each of the cBN bodies 21 to 38 of the comparative examples under conditions shown in Table5 in accordance with the same procedures as in the case of the Tools of Examples of the present invention, and thus comparative example coated cBN tools (referred to as "Tools of Comparative Examples") 21 to 38 shown in Table 6 were produced.

All of the compositions in the type of the cathode electrode (target) for forming an A layer and the type of the cathode electrode (target) for forming a B layer in Table5 are based on an atomic ratio.

Regarding the Tools of Examples of the present invention 1 to 12 and the Tools of Comparative Examples 21 to 38 produced as described above, cross section measurement was performed on a vertical section (cross section vertical to the surface of the tool body 1) of the hard coating layer using a scanning electron microscope (SEM), a transmission electron microscope (TEM), and energy dispersive X-ray spectroscopy (EDS) to measure the compositions and the one-layer thicknesses of the A layer and the B layer at plural places, and the measured values were averaged to calculate the compositions and the average single layer thicknesses.

Specifically, the composition was measured as follows. That is, a region of 5 μm×5 μm observed by SEM was subjected to line analysis by EDS. In each layer constituting the alternate laminated structure, 5 μm-line analysis was performed at 5 places at intervals of 1 μm in a direction vertical to the surface of the tool body. Accordingly, x or y and z of each measurement place were obtained. The obtained x's, y's, and z's were averaged respectively. The obtained values are shown in Tables 3 and 6 as compositions of the A layer and the B layer.

The average single layer thickness was measured as follows. That is, a boundary between the A layer and the B layer or between the A layer and the surface of the tool body was determined by an elemental mapping image obtained by plane analysis of EDS in a region of 5 μm×5 μm observed by SEM. In addition, regarding the layers constituting the alternate laminated structure, an interval between the boundaries of the layers in a direction vertical to the surface of the tool body was measured. In the layers, the interval was measured at 5 places at intervals of 1 μm in a direction parallel to the surface of the tool body. Regarding the A layer and the B layer, the measured intervals were averaged. The obtained values are shown in Tables 3 and 6 as average single layer thicknesses of the A layer and the B layer.

In addition, in the hard coating layers of the tools 1 to 12 of the present invention and the tools 21 to 38 of the comparative example, the diffraction angle (2θ) indicating the X-ray diffraction peak of the (200) plane was obtained through X-ray diffraction from their surfaces, and the values of the full width at half maximum of the peak at the corresponding diffraction angle were obtained.

The X-ray diffraction was measured in the condition of the measurement condition of a Cu bulb (using a CuKα wire), the measurement range (2θ) ranging from 30 to 80 degrees, the scanning step of 0.013 degrees, and the measurement time per step of 0.48 sec/step. Specifically, in the condition described above, the intensity of the diffraction X-rays was measured by performing irradiation of X-rays from the surface of the hard coating layer. An X-ray diffraction pattern with the horizontal axis as the diffraction angle (2θ) and the vertical axis as the intensity of diffraction X-rays as in FIG. 3 was drawn, and the peak near the diffraction angle (2θ) of 44 degrees was accounted as the X-ray diffraction peak of the (200) plane. Tables 3 and 6 show the diffraction angle (2θ) at which the obtained X-ray diffraction peak of the (200) plane is positioned and the full width at half maximum of this peak, as the diffraction angle of the peak and the full width at half maximum of the diffraction peak.

The hardness of the B layer as an outermost surface layer of each of the Tools of Examples of the present invention 1 to 12 and the Tools of Comparative Examples 21 to 38 was obtained.

As the hardness of the B layer of the outermost surface, nano-indentation hardness was obtained by a nano-indentation method. The results are shown in Tables 3 and 6.

A nano-indentation test was performed on the B layer as an outermost surface layer of each of the Tools of Examples of the present invention 1 to 12 and the Tools of Comparative Examples 21 to 38 to calculate a plastic deformation work ratio $W_{plast}/(W_{plast}+W_{elast})$ from a displacement-load loading curve and a displacement-load unloading curve.

More specifically, using a Berkovich indenter (dihedral angle: 115° C.) made of diamond, a nano-indentation test was performed with a load of 200 mg at an indentation depth of not greater than 1/10 of the layer thickness of the B layer (see FIG. 4A). Accordingly, the surface of the B layer was displaced, and a displacement-load loading curve and a displacement-load unloading curve were obtained (see FIG. 4B). Plastic deformation work ratio $W_{plast}$ and elastic deformation work $W_{elast}$ were obtained from a difference (area) between the displacement-load loading curve and the displacement-load unloading curve, and using these values, a plastic deformation work ratio $W_{plast}/(W_{plast}+W_{elast})$ was calculated. The nano-indentation test was performed at 5 places in each tool. The average of the obtained plastic deformation work ratios is shown in Tables 3 and 6 as a plastic deformation work ratio.

FIG. 4B illustrates a schematic view illustrating a displacement-load loading curve L and a displacement-load unloading curve U measured in regard to the B layer as an outermost surface layer of the hard coating layer of the invention tool 1. A test load P is determined depending on the layer thickness of the tool such that the indentation depth is not greater than 1/10 of the layer thickness of the B layer even in a sample in which the layer thickness of the B layer of the outermost surface is the smallest among samples measured at the same time. Regarding the measurement results shown in FIG. 4B, it was confirmed that the test was performed with a test load of 200 mg and the indentation depth was not greater than 1/10 of the layer thickness of the B layer.

Tables 3 and 6 show the various values obtained as described above. In Table 6, "-" is displayed in the fields of the items related to the B layer in regard to the Tools of Comparative Examples having no B layer therein.

TABLE 1

| Type of sintered material | Component composition (vol %) and average grain size (μm) | | | | | | | | | | | | | |
|---|---|---|---|---|---|---|---|---|---|---|---|---|---|---|
| | TiC | | TiN | | TiCN | | WC | | AlN | | TiB$_2$ | | Al$_2$O$_3$ | cBN |
| | vol % | μm | vol % | μm | vol % | μm | vol % | μm | vol % | μm | vol % | μm | vol % μm | vol % |
| 1 | — | — | 25.3 | 0.5 | — | — | 0.3 | 0.2 | 1.1 | 0.3 | 4.1 | 0.2 | 9.0 0.3 | 60.2 |
| 2 | — | — | 15.0 | 0.3 | — | — | 0.3 | 0.3 | 3.6 | 0.1 | 3.5 | 0.2 | 2.5 0.2 | 75.1 |
| 3 | — | — | 24.5 | 0.5 | — | — | 0.4 | 0.3 | 2.0 | 0.4 | 4.0 | 0.3 | 7.5 0.4 | 61.6 |
| 4 | — | — | 39.7 | 0.2 | — | — | 0.5 | 0.3 | 1.2 | 0.2 | 4.8 | 0.3 | 3.6 0.2 | 50.2 |
| 5 | — | — | 33.6 | 1.0 | 12.6 | 1.0 | 1.0 | 0.2 | 1.0 | 0.5 | 6.6 | 0.4 | 6.9 0.3 | 38.3 |
| 6 | — | — | 19.0 | 0.7 | 8.8 | 0.7 | 1.6 | 0.1 | 1.5 | 0.3 | 5.3 | 0.3 | 8.8 0.4 | 55.0 |
| 7 | 45.3 | 0.8 | — | — | — | — | 1.8 | 0.3 | 4.6 | 0.2 | 2.3 | 0.3 | 1.7 0.1 | 44.3 |
| 8 | 10.8 | 0.6 | 9.6 | 0.6 | — | — | 0.8 | 0.4 | 2.7 | 0.4 | 3.8 | 0.2 | 4.6 0.2 | 67.7 |
| 9 | — | — | — | — | 28.4 | 0.5 | 0.6 | 0.4 | 0.8 | 0.3 | 8.5 | 0.4 | 3.3 0.3 | 58.4 |
| 10 | 32.8 | 0.4 | — | — | — | — | 0.7 | 0.5 | 1.8 | 0.5 | 4.1 | 0.3 | 4.4 0.4 | 56.2 |
| 11 | 20.7 | 0.3 | — | — | 27.4 | 0.3 | 1.5 | 0.2 | 2.7 | 0.1 | 7.2 | 0.5 | 3.1 0.5 | 37.4 |
| 12 | — | — | 21.4 | 0.8 | — | — | 0.2 | 0.2 | 3.2 | 0.3 | 2.0 | 0.2 | 2.3 0.3 | 70.9 |

TABLE 2

| Type | | Type of sintered material | Type of cathode electrode (target) | | Temperature inside apparatus (°C.) | Rotation speed of rotation table (rpm) | Deposition condition when forming A layer | | | Deposition condition when forming B layer | | |
|---|---|---|---|---|---|---|---|---|---|---|---|---|
| | | | For forming A layer | For forming B layer | | | N₂ gas pressure (Pa) | DC bias current (V) | Arc current (A) | N₂ gas pressure (Pa) | DC bias current (V) | Arc current (A) |
| Tools of the present invention | 1 | 1 | Al 0.60 Ti 0.40 | Cr 0.50 Al 0.50 | 500 | 2.0 | 6.0 | −30 | 150 | 6.0 | −30 | 120 |
| | 2 | 2 | Al 0.50 Ti 0.50 | Cr 0.47 Al 0.50 Si 0.03 | 450 | 2.5 | 4.0 | −40 | 180 | 4.0 | −50 | 140 |
| | 3 | 3 | Al 0.50 Ti 0.50 | Cr 0.60 Al 0.40 | 500 | 1.5 | 2.0 | −50 | 120 | 8.0 | −25 | 180 |
| | 4 | 4 | Al 0.60 Ti 0.40 | Cr 0.70 Al 0.30 | 550 | 2.0 | 8.0 | −30 | 140 | 6.0 | −40 | 150 |
| | 5 | 5 | Al 0.70 Ti 0.30 | Cr 0.75 Al 0.20 V 0.05 | 500 | 3.0 | 6.0 | −25 | 150 | 8.0 | −10 | 200 |
| | 6 | 6 | Al 0.45 Ti 0.55 | Cr 0.40 Al 0.60 | 450 | 2.0 | 10.0 | −75 | 200 | 10.0 | −20 | 150 |
| | 7 | 7 | Al 0.55 Ti 0.45 | Cr 0.69 Al 0.30 Zr 0.01 | 450 | 2.0 | 2.5 | −50 | 180 | 4.0 | −75 | 100 |
| | 8 | 8 | Al 0.60 Ti 0.40 | Cr 0.90 Al 0.05 B 0.05 | 500 | 2.5 | 6.0 | −10 | 150 | 8.0 | −30 | 180 |
| | 9 | 9 | Al 0.45 Ti 0.55 | Cr 0.60 Al 0.40 | 550 | 2.0 | 4.0 | −40 | 120 | 6.0 | −30 | 140 |
| | 10 | 10 | Al 0.55 Ti 0.45 | Cr 0.90 Al 0.10 | 500 | 2.0 | 8.0 | −30 | 150 | 6.0 | −40 | 150 |
| | 11 | 11 | Al 0.50 Ti 0.50 | Cr 0.37 Al 0.60 Nb 0.03 | 500 | 2.0 | 2.5 | −50 | 170 | 2.5 | −55 | 120 |
| | 12 | 12 | Al 0.45 Ti 0.55 | Cr 0.49 Al 0.50 W 0.01 | 550 | 2.5 | 4.0 | −40 | 150 | 4.0 | −30 | 150 |

TABLE 3

| Type | | Type of sintered material | cBN grains in sintered material | | A layer | | B layer | |
|---|---|---|---|---|---|---|---|---|
| | | | Peak value of grain size distribution (μm) | Full width at half maximum of peak (μm) | Composition of layer (value of x) | Average layer thickness of one layer (μm) | Type of composition M | Composition of layer (value of y) |
| Tools of the present invention | 1 | 1 | 0.74 | 0.49 | 0.58 | 0.5 | — | 0.48 |
| | 2 | 2 | 0.86 | 0.66 | 0.48 | 0.6 | Si | 0.48 |
| | 3 | 3 | 0.59 | 0.35 | 0.48 | 0.2 | — | 0.38 |
| | 4 | 4 | 0.92 | 0.70 | 0.58 | 0.8 | — | 0.28 |
| | 5 | 5 | 0.65 | 0.39 | 0.67 | 1.2 | V | 0.18 |
| | 6 | 6 | 0.56 | 0.34 | 0.43 | 0.9 | — | 0.58 |
| | 7 | 7 | 0.78 | 0.53 | 0.52 | 0.3 | Zr | 0.29 |
| | 8 | 8 | 0.83 | 0.57 | 0.57 | 2.5 | B | 0.04 |
| | 9 | 9 | 0.97 | 0.62 | 0.42 | 0.4 | — | 0.38 |
| | 10 | 10 | 0.61 | 0.35 | 0.53 | 0.7 | — | 0.09 |
| | 11 | 11 | 0.72 | 0.59 | 0.47 | 1.8 | Nb | 0.57 |
| | 12 | 12 | 0.85 | 0.66 | 0.42 | 0.5 | W | 0.49 |

| Type | | B layer | | (200) plane | | Hardness of B layer (GPa) | Plastic deformation work ratio of B layer | Total layer thickness (μm) |
|---|---|---|---|---|---|---|---|---|
| | | Composition of layer (value of z) | Average layer thickness of one layer (μm) | Diffraction angle of peak (degree) | Full width at half maximum of diffraction peak (degree) | | | |
| Tools of the present invention | 1 | 0.00 | 0.5 | 43.60 | 0.25 | 37 | 0.38 | 1.0 |
| | 2 | 0.03 | 1.2 | 43.59 | 0.27 | 39 | 0.36 | 1.8 |
| | 3 | 0.00 | 0.8 | 43.62 | 0.24 | 36 | 0.39 | 3.0 |
| | 4 | 0.00 | 1.7 | 43.64 | 0.23 | 35 | 0.40 | 2.5 |

TABLE 3-continued

| | | | | | | | |
|---|---|---|---|---|---|---|---|
| 5 | 0.05 | 0.2 | 43.66 | 0.25 | 33 | 0.43 | 2.8 |
| 6 | 0.00 | 2.5 | 43.55 | 0.28 | 40 | 0.36 | 3.4 |
| 7 | 0.01 | 0.4 | 43.64 | 0.26 | 35 | 0.37 | 1.4 |
| 8 | 0.05 | 0.4 | 43.68 | 0.22 | 29 | 0.48 | 2.9 |
| 9 | 0.00 | 0.3 | 43.61 | 0.24 | 36 | 0.38 | 2.1 |
| 10 | 0.00 | 0.4 | 43.68 | 0.26 | 31 | 0.45 | 22 |
| 11 | 0.03 | 0.7 | 43.53 | 0.27 | 42 | 0.35 | 2.5 |
| 12 | 0.01 | 1.3 | 43.58 | 0.23 | 38 | 0.37 | 3.6 |

TABLE 4

| Type of sintered material | Component composition (vol %) and average grain size (μm) | | | | | | | | | | | | | | |
|---|---|---|---|---|---|---|---|---|---|---|---|---|---|---|---|
| | TiC | | TiN | | TiCN | | WC | | AlN | | TiB$_2$ | | Al$_2$O$_3$ | | cBN |
| | vol % | μm | vol % | μm | vol % | μm | vol % | μm | vol % | μm | vol % | μm | vol % | μm | vol % |
| 21 | — | — | 36.7 | 0.4 | — | — | 1.2 | 0.3 | 1.9 | 0.2 | 5.2 | 0.4 | 4.5 | 0.2 | 50.5 |
| 22 | — | — | 15.2 | 0.3 | — | — | 1.5 | 0.3 | 3.2 | 0.4 | 4.3 | 0.3 | 3.2 | 0.5 | 72.6 |
| 23 | — | — | — | — | 23.5 | 0.5 | 0.8 | 0.4 | 2.4 | 0.4 | 3.7 | 0.4 | 6.8 | 0.3 | 62.8 |
| 24 | — | — | 24.7 | 0.7 | 15.7 | 0.7 | 0.6 | 0.4 | 1.3 | 0.3 | 8.1 | 0.5 | 7.7 | 0.4 | 41.9 |
| 25 | — | — | *52.0 | 0.9 | — | — | 0.3 | 0.5 | 3.8 | 0.5 | *11.3 | 0.3 | 5.3 | 0.5 | *27.3 |
| 26 | 27.1 | 0.6 | — | — | — | — | 1.4 | 0.3 | *5.8 | 0.3 | 6.9 | 0.3 | *1.2 | 0.2 | 57.6 |
| 27 | — | — | — | — | *9.6 | 0.3 | 1.8 | 0.2 | 0.8 | 0.1 | 2.9 | 0.2 | 1.9 | 0.1 | *83.0 |
| 28 | 22.2 | 0.5 | — | — | — | — | *0.0 | 0.0 | 4.7 | 0.5 | 3.1 | 0.6 | 3.6 | 0.5 | 66.4 |
| 29 | *54.7 | 1.5 | — | — | — | — | 1.8 | 0.1 | 2.8 | 0.3 | 7.4 | 0.3 | 5.6 | 0.3 | *27.7 |
| 30 | — | — | 10.9 | 0.8 | 22.9 | 0.8 | 1.2 | 0.4 | *0.1 | 0.5 | 5.9 | 0.4 | *10.8 | 0.3 | 48.2 |
| 31 | — | — | 23.4 | 0.5 | — | — | 0.7 | 0.7 | 3.8 | 0.2 | *1.8 | 0.3 | 2.2 | 0.4 | 68.1 |
| 32 | 26.8 | 0.8 | — | — | — | — | *2.4 | 0.5 | 4.2 | 0.7 | 4.8 | 0.5 | 6.3 | 0.8 | 55.5 |

The marks * indicate items excluded from the present embodiment.

TABLE 5

| | | | Type of cathode electrode (target) | | Deposition conditions | | | | | | | |
|---|---|---|---|---|---|---|---|---|---|---|---|---|
| | | | | | Temperature | Rotation | Deposition condition when forming A layer | | | Deposition condition when forming B layer | | |
| Type | | Type of sintered material | For forming A layer | For forming B layer | inside apparatus (° C.) | speed of rotation table (rpm) | N$_2$ gas pressure (Pa) | DC bias current (V) | Arc current (A) | N$_2$ gas pressure (Pa) | DC bias current (V) | Arc current (A) |
| Tools of Comparative Example | 21 | 21 | *Al 0.35 Ti 0.75 | Cr 0.60 Al 0.40 | 450 | 2.5 | 4.0 | −50 | 150 | 4.0 | −55 | 120 |
| | 22 | 22 | Al 0.50 Ti 0.50 | *Cr 0.95 Si 0.05 | 550 | 2.0 | 8.0 | −50 | 120 | 8.0 | −25 | 180 |
| | 23 | 23 | *— | Cr 0.50 Al 0.50 | 500 | 1.5 | *— | *— | *— | 4.0 | −50 | 150 |
| | 24 | 24 | Al 0.60 Ti 0.40 | *— | 450 | 2.0 | 6.0 | −30 | 180 | *— | *— | *— |
| | 25 | 21 | *Al 0.75 Ti 0.25 | Cr 0.60 Al 0.40 | 500 | 3.0 | 10.0 | −20 | 120 | 4.0 | −30 | 180 |
| | 26 | 22 | Al 0.55 Ti 0.45 | *Cr 0.35 Al 0.65 | 550 | 2.0 | 2.5 | −75 | 200 | 8.0 | −75 | 150 |
| | 27 | 23 | Al 0.50 Ti 0.50 | *Cr 0.43 Al 0.50 Si 0.07 | 450 | 2.5 | 4.0 | −50 | 180 | 4.0 | −50 | 200 |
| | 28 | 24 | Al 0.50 Ti 0.50 | Cr 0.68 Al 0.30 V 0.02 | 500 | 2.0 | 6.0 | −40 | 160 | 6.0 | −20 | 150 |
| | 29 | 21 | Al 0.45 Ti 0.55 | Cr 0.80 Al 0.20 | 500 | 2.0 | 8.0 | −30 | 140 | 4.0 | −10 | 160 |
| | 30 | 22 | Al 0.70 Ti 0.30 | Cr 0.57 Al 0.40 B 0.03 | 450 | 1.5 | 4.0 | −40 | 150 | 2.5 | −40 | 150 |
| | 31 | 25 | Al 0.60 Ti 0.40 | Cr 0.50 Al 0.50 | 500 | 2.0 | 6.0 | −30 | 150 | 6.0 | −30 | 120 |
| | 32 | 26 | Al 0.50 Ti 0.50 | Cr 0.47 Al 0.50 W 0.03 | 450 | 2.5 | 4.0 | −40 | 180 | 4.0 | −50 | 140 |

TABLE 5-continued

| | | Type of cathode electrode (target) | | Temperature | Rotation | Deposition condition when forming A layer | | | Deposition condition when forming B layer | | |
|---|---|---|---|---|---|---|---|---|---|---|---|
| Type | Type of sintered material | For forming A layer | For forming B layer | inside apparatus (° C.) | speed of rotation table (rpm) | N₂ gas pressure (Pa) | DC bias current (V) | Arc current (A) | N₂ gas pressure (Pa) | DC bias current (V) | Arc current (A) |
| 33 | 27 | Al 0.50 Ti 0.50 | Cr 0.60 Al 0.40 | 500 | 1.5 | 2.0 | −50 | 120 | 8.0 | −25 | 180 |
| 34 | 28 | Al 0.60 Ti 0.40 | Cr 0.70 Al 0.30 | 550 | 2.0 | 8.0 | −30 | 140 | 6.0 | −40 | 150 |
| 35 | 29 | Al 0.45 Ti 0.55 | Cr 0.40 Al 0.60 | 450 | 2.0 | 10.0 | −75 | 200 | 10.0 | −20 | 150 |
| 36 | 30 | Al 0.60 Ti 0.40 | Cr 0.90 Al 0.05 B 0.05 | 500 | 2.5 | 6.0 | −10 | 150 | 8.0 | −30 | 180 |
| 37 | 31 | Al 0.55 Ti 0.45 | Cr 0.90 Al 0.10 | 500 | 2.0 | 8.0 | −30 | 150 | 6.0 | −40 | 150 |
| 38 | 32 | Al 0.45 Ti 0.55 | Cr 0.49 Al 0.50 Zr 0.01 | 550 | 2.5 | 4.0 | −40 | 150 | 4.0 | −30 | 150 |

The marks * indicate items excluded from the present embodiment.

TABLE 6

| | | cBN grains in sintered material | | A layer | | B layer | |
|---|---|---|---|---|---|---|---|
| Type | Type of sintered material | Peak value of grain size distribution (μm) | Full width at half maximum of peak (μm) | Composition of layer (value of x) | Average layer thickness of one layer (μm) | Type of composition M | Composition of layer (value of y) |
| Tools of Comparative Example | 21 | 21 | 0.94 | 0.68 | *0.32 | 0.5 | — | 0.38 |
| | 22 | 22 | 0.76 | 0.51 | 0.48 | 0.4 | Si | *0.00 |
| | 23 | 23 | 0.67 | 0.42 | *— | *— | — | 0.48 |
| | 24 | 24 | 0.83 | 0.60 | 0.59 | 2.5 | — | *— |
| | 25 | 21 | 0.94 | 0.68 | *0.72 | 1.0 | — | 0.38 |
| | 26 | 22 | 0.76 | 0.51 | 0.53 | 0.8 | — | *0.62 |
| | 27 | 23 | 0.67 | 0.42 | 0.49 | 0.5 | Si | 0.48 |
| | 28 | 24 | 0.83 | 0.60 | 0.49 | *3.1 | V | 0.29 |
| | 29 | 21 | 0.94 | 0.68 | 0.42 | 0.4 | — | 0.19 |
| | 30 | 22 | 0.76 | 0.51 | 0.67 | 2.2 | B | 0.39 |
| | 31 | 25 | 0.74 | 0.49 | 0.58 | 0.5 | — | 0.48 |
| | 32 | 26 | 0.86 | 0.66 | 0.48 | 0.6 | W | 0.48 |
| | 33 | 27 | 0.59 | 0.35 | 0.48 | 0.2 | — | 0.38 |
| | 34 | 28 | 0.92 | 0.70 | 0.58 | 0.8 | — | 0.28 |
| | 35 | 29 | 0.56 | 0.34 | 0.43 | 0.9 | — | 0.58 |
| | 36 | 30 | 0.83 | 0.57 | 0.57 | 2.5 | B | 0.04 |
| | 37 | 31 | *1.18 | *0.75 | 0.53 | 0.7 | — | 0.09 |
| | 38 | 32 | *0.47 | *0.30 | 0.42 | 0.5 | Zr | 0.49 |

| | | B layer | | (200) plane | | | Plastic | Total |
|---|---|---|---|---|---|---|---|---|
| Type | | Composition of layer (value of z) | Average layer thickness of one layer (μm) | Diffraction angle of peak (degree) | Full width at half maximum of diffraction peak (degree) | Hardness of B layer (GPa) | deformation work ratio of B layer | layer thickness (μm) |
| Tools of Comparative Example | 21 | 0.00 | 1.5 | 43.61 | *0.18 | 32 | 0.37 | 2.0 |
| | 22 | 0.04 | 0.7 | *43.72 | 0.25 | *26 | *0.52 | 3.3 |
| | 23 | 0.00 | 3.0 | 43.66 | *0.32 | 36 | 0.39 | 3.0 |
| | 24 | *— | *— | *43.48 | 0.28 | — | — | 2.5 |
| | 25 | 0.00 | 2.0 | 43.63 | 0.27 | 34 | 0.40 | 3.0 |
| | 26 | 0.00 | 0.6 | 43.50 | 0.22 | *43 | *0.34 | 2.8 |
| | 27 | *0.07 | 0.5 | 43.61 | 0.24 | 38 | 0.37 | 2.0 |
| | 28 | 0.02 | 0.5 | 43.65 | 0.28 | 33 | 0.41 | 3.6 |
| | 29 | 0.00 | *3.2 | 43.67 | 0.25 | 32 | 0.44 | 3.6 |
| | 30 | 0.03 | 2.0 | 43.62 | 0.26 | 35 | 0.38 | *4.2 |
| | 31 | 0.00 | 0.5 | 43.60 | 0.25 | 37 | 0.38 | 1.0 |
| | 32 | 0.03 | 1.2 | 43.59 | 0.27 | 39 | 0.36 | 1.8 |
| | 33 | 0.00 | 0.8 | 43.62 | 0.24 | 36 | 0.39 | 3.0 |

TABLE 6-continued

| | | | | | | | |
|---|---|---|---|---|---|---|---|
| 34 | 0.00 | 1.7 | 43.64 | 0.23 | 35 | 0.40 | 2.5 |
| 35 | 0.00 | 2.5 | 43.55 | 0.28 | 40 | 0.36 | 3.4 |
| 36 | 0.05 | 0.4 | 43.68 | 0.22 | 29 | 0.48 | 2.9 |
| 37 | 0.00 | 0.4 | 43.68 | 0.26 | 31 | 0.45 | 2.2 |
| 38 | 0.01 | 1.3 | 43.58 | 0.23 | 38 | 0.37 | 3.6 |

The marks * indicate items excluded from the present embodiment.

Next, the Tools of Examples of the present invention 1 to 12 and the Tools of Comparative Examples 21 to 38 were subjected to a cutting test under the following conditions.

Work Material: round bar having eight longitudinal grooves at equal intervals in a length direction of JIS·Scr420 (60 HRC)

Cutting Speed: 200 m/min

Cut: 0.05 mm

Feed: 0.05 mm/rev.

Cutting Time: 15 minutes

Under the above conditions, a dry strong intermittent cutting test for chrome steel was performed. A wear width of a flank face of the cutting edge was measured, and the presence or absence of the occurrence of fractures was observed. Table 7 shows the results of the test.

TABLE 7

| Type | | Wear amount of flank face (mm) | Presence or Absence of fracture |
|---|---|---|---|
| Tools of the present invention | 1 | 0.08 | Absent |
| | 2 | 0.10 | Absent |
| | 3 | 0.08 | Absent |
| | 4 | 0.09 | Absent |
| | 5 | 0.12 | Absent |
| | 6 | 0.08 | Absent |
| | 7 | 0.11 | Absent |
| | 8 | 0.08 | Absent |
| | 9 | 0.07 | Absent |
| | 10 | 0.13 | Absent |
| | 11 | 0.11 | Absent |
| | 12 | 0.07 | Absent |
| Tools of Comparative Example | 21 | 0.24 | Absent |
| | 22 | 0.32 | Absent |
| | 23 | 0.21 | Absent |
| | 24 | *7 | Present |
| | 25 | 0.30 | Absent |
| | 26 | *6 | Present |
| | 27 | *10 | Present |
| | 28 | 0.24 | Absent |
| | 29 | *15 | Present |
| | 30 | *12 | Present |
| | 31 | *3 | Present |
| | 32 | *11 | Present |
| | 33 | 0.38 | Absent |
| | 34 | 0.25 | Absent |
| | 35 | *5 | Present |
| | 36 | *8 | Present |
| | 37 | 0.29 | Absent |
| | 38 | 0.27 | Absent |

The marks * in the tools of Comparative Example indicate the cutting time (min) until the service life of the tool comes to an end due to occurrence of chipping.

According to the results of Table 7, the average wear width of the flank faces was approximately 0.09 mm in the Tools of Examples of the present invention 1 to 12. In the Tools of Comparative Examples 21 to 38, wear of the flank faces progressed, and thus the wear amount increased. In addition, in some cases, the end of the service life of the tool was reached in a relatively short period of time due to the occurrence of fractures.

From these results, the Tools of Examples of the present invention 1 to 12 are found to have both excellent fracture resistance and excellent wear resistance under strong intermittent cutting conditions.

INDUSTRIAL APPLICABILITY

A surface-coated cBN tool according to the invention exhibits excellent fracture resistance and wear resistance in cutting under strong intermittent cutting conditions for alloy steel, and even in high-speed continuous cutting of various work materials accompanied with generation of high heat, and exhibits excellent cutting performance for a long period of time. Accordingly, the surface-coated cBN tool according to the invention can sufficiently satisfactorily meets an increase in the performance of machine tools, and power saving, energy saving, and cost reduction in cutting.

REFERENCE SIGNS LIST

1: Tool body (cBN substrate)
2: Hard coating layer
2A: A layer
2B: B layer

The invention claimed is:

1. A surface-coated cubic boron nitride sintered material tool comprising:
   a tool body which is made of a cubic boron nitride sintered material; and
   a hard coating layer formed on a surface of the tool body, the hard coating layer being made of an alternate laminated structure, in which at least one A layer and at least one B layer are alternately laminated, and having a total layer thickness of 0.5 to 4.0 μm,
   wherein (a) the cubic boron nitride sintered material has a composition including:
   10 to 50 vol % of one or more of TiC, TiN, and TiCN;
   0.1 to 2 vol % of WC;
   0.3 to 5 vol % of AN;
   2 to 10 vol % of $TiB_2$;
   1.5 to 10 vol % of $Al_2O_3$; and
   30 to 80 vol % of cBN (cubic boron nitride),
   (b) when a grain size distribution of cBN grains in the cubic boron nitride sintered material is measured, a graph of the grain size distribution contains a single peak of the grain size distribution, said single peak being within a range of a grain size from 0.50 to 1.00 μm, and a value of a full width at half maximum of the single peak satisfies a range from 0.33 to 0.73 μm,
   (c) the A layer is a Ti and Al complex nitride layer, which has an average single layer thickness of 0.1 to 3.0 μm and has an average composition satisfying $0.4 \leq x \leq 0.7$ (x represents a content ratio of Al in terms of atomic ratio) in a case where the A layer is represented by a composition formula $(Ti_{1-x}Al_x)N$,
   (d) the B layer is a Cr, Al and M complex nitride layer, which has an average single layer thickness of 0.1 to 3.0 μm and has an average composition satisfying 0.03

≤y≤0.6 and 0≤z≤0.05(y represents a content ratio of Al in terms of atomic ratio, z represents a total content ratio of the component M in terms of atomic ratio, and the component M represents one or more elements selected from group 4a elements excluding Cr, group5a elements, group 6a elements, B and Si in the periodic table) in a case where the B layer is represented by a composition formula $(Cr_{1-y-z}Al_yM_z)N$, and (e) when an X-ray diffraction measurement is performed for the entirety of the hard coating layer constituted of the A layer and the B layer, an X-ray diffraction peak of a (200) plane is present at a position of a diffraction angle of 43.6 plus or minus 0.1 degrees, and a full width at half maximum of the diffraction peak satisfies 0.25 plus or minus 0.05 degrees.

2. The surface-coated cubic boron nitride sintered material tool according to claim 1,
wherein a value of a plastic deformation work ratio $W_{plast}/(W_{plast}+W_{elast})$ of the B layer, which is obtained by performing a nanoindentation test for the B layer with a load set to achieve an indentation depth of 1/10 times or smaller than a layer thickness, is within a range from 0.35 to 0.50.

3. The surface-coated cubic boron nitride sintered material tool according to claim 1,
wherein the A layer is formed immediately on the surface of the tool body and the B layer is formed as an outermost surface of the hard coating layer.

4. The surface-coated cubic boron nitride sintered material tool according to claim 1,
wherein the surface of the tool body has been subjected to bombardment treatment with argon ion prior to depositing the hard coating layer on the surface of the tool body.

* * * * *